United States Patent
Huang et al.

(10) Patent No.: US 9,536,738 B2
(45) Date of Patent: Jan. 3, 2017

(54) VERTICAL GATE ALL AROUND (VGAA) DEVICES AND METHODS OF MANUFACTURING THE SAME

(71) Applicant: Taiwan Semiconductor Manufacturing Company, Ltd., Hsin-Chin (TW)

(72) Inventors: Yu-Lien Huang, Jhubei (TW); Chun-Hsiung Lin, Zhubei (TW); Chi-Wen Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/640,726

(22) Filed: Mar. 6, 2015

(65) Prior Publication Data

US 2016/0240378 A1     Aug. 18, 2016

Related U.S. Application Data

(60) Provisional application No. 62/115,730, filed on Feb. 13, 2015.

(51) Int. Cl.

| H01L 21/02 | (2006.01) |
|---|---|
| H01L 21/76 | (2006.01) |
| H01L 29/78 | (2006.01) |
| H01L 21/762 | (2006.01) |
| H01L 29/423 | (2006.01) |
| H01L 29/06 | (2006.01) |
| H01L 29/66 | (2006.01) |

(52) U.S. Cl.
CPC ... *H01L 21/02694* (2013.01); *H01L 21/76205* (2013.01); *H01L 29/0649* (2013.01); *H01L 29/42356* (2013.01); *H01L 29/66666* (2013.01); *H01L 29/7827* (2013.01)

(58) Field of Classification Search
CPC ............ H01L 29/7813; H01L 29/7802; H01L 29/7827; H01L 29/66666; H01L 29/0696; H01L 21/02; H01L 21/02694; H01L 21/76; H01L 21/76205
USPC ........................................................ 257/329
See application file for complete search history.

(56) References Cited

U.S. PATENT DOCUMENTS

| 6,900,096 B2 * | 5/2005 | Dong ................ H01L 21/28273 257/E21.209 |
|---|---|---|
| 8,487,378 B2 | 7/2013 | Goto et al. |
| 8,729,634 B2 | 5/2014 | Shen et al. |
| 8,826,213 B1 | 9/2014 | Ho et al. |
| 8,887,106 B2 | 11/2014 | Ho et al. |
| 2014/0138766 A1 * | 5/2014 | Ananthan ........... H01L 29/7391 257/330 |
| 2014/0282326 A1 | 9/2014 | Chen et al. |

* cited by examiner

*Primary Examiner* — Monica D Harrison
(74) *Attorney, Agent, or Firm* — Slater Matsil, LLP

(57) ABSTRACT

Vertical gate all around (VGAA) devices and methods of manufacture thereof are described. A method for manufacturing a VGAA device includes: forming a first doped region having a first conductivity in a substrate; forming a second doped region having a second conductivity different from the first conductivity in the substrate, the second doped region disposed laterally adjacent to and spaced apart from the first doped region; and oxidizing a semiconductive layer disposed between the substrate and the second doped region to form an oxidized isolation layer.

20 Claims, 30 Drawing Sheets

VERTICAL GATE ALL AROUND (VGAA) DEVICES AND METHODS OF MANUFACTURING THE SAME

PRIORITY CLAIM AND CROSS-REFERENCE

This application claims the benefit of U.S. Provisional Application Ser. No. 62/115,730, filed on Feb. 13, 2015, entitled "Vertical Gate All Around (VGAA) Devices and Methods of Manufacturing the Same," which application is hereby incorporated herein by reference.

BACKGROUND

As the semiconductor industry has progressed into nanometer technology nodes in pursuit of higher device density, higher performance, and lower costs, challenges from both fabrication and design issues have resulted in the development of three-dimensional designs, such as a vertical gate all around (VGAA) transistor. A typical VGAA transistor enables enhanced control of the charge carriers along the lengthwise direction through a complete encirclement of the channel region of a semiconductor nanowire by a gate dielectric and a gate electrode. The VGAA transistor has a reduced short channel effect (e.g. compared to a planar transistor), because the channel region may be surrounded by the gate electrode so that an effect of the source/drain region on an electric field of the channel region may be reduced (e.g. relative to a planar transistor).

However, there are challenges to manufacturing a VGAA transistor. For example, the processes and methods utilized in complementary metal-oxide-semiconductor (CMOS) fabrication may not be specifically tailored for the manufacture of VGAA transistors. As such, improvements are needed in the manufacturing processes in order to manufacture VGAA transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
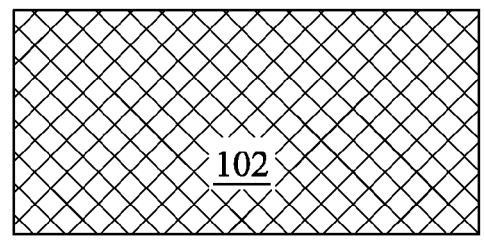
FIGS. 1A to 1T and 2A to 2Q show process flows illustrating various intermediary steps of manufacturing a semiconductor device having an oxidized isolation layer formed beneath a first vertical gate all around (VGAA) device and a second VGAA device, in accordance with one or more embodiments.

The following disclosure provides many different embodiments, or examples, for implementing different features of the provided subject matter. Specific examples of components and stacks are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
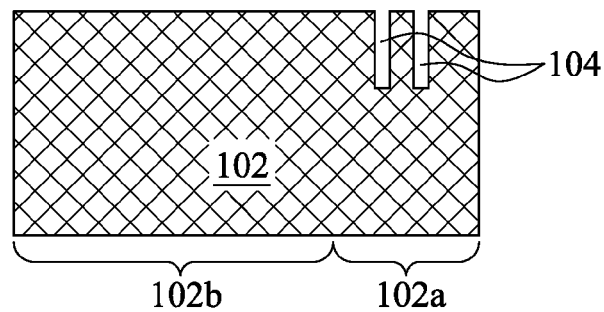
Figure 1C:
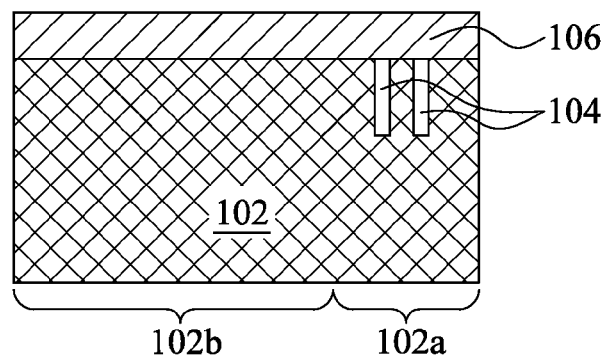
Figure 1D:
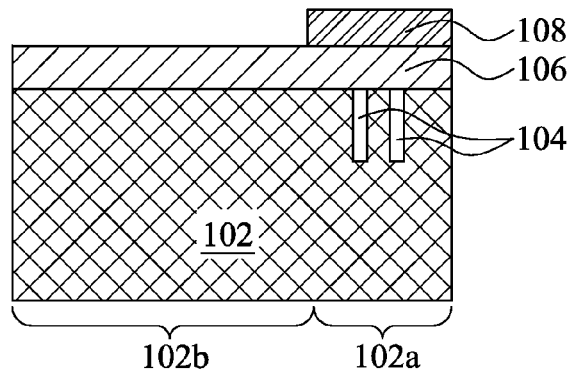
Figure 1E:
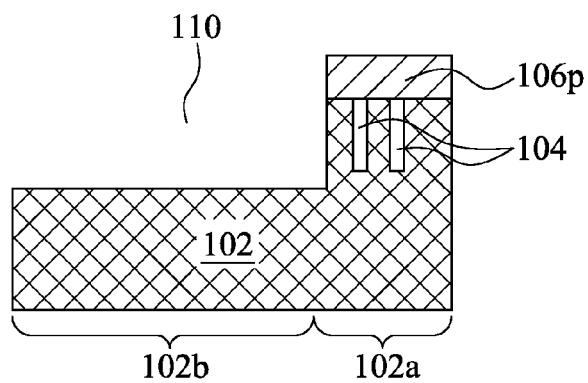
Figure 1F:
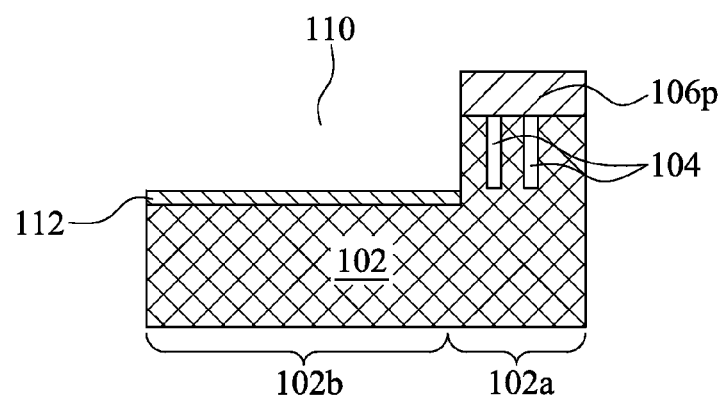
Figure 1G:
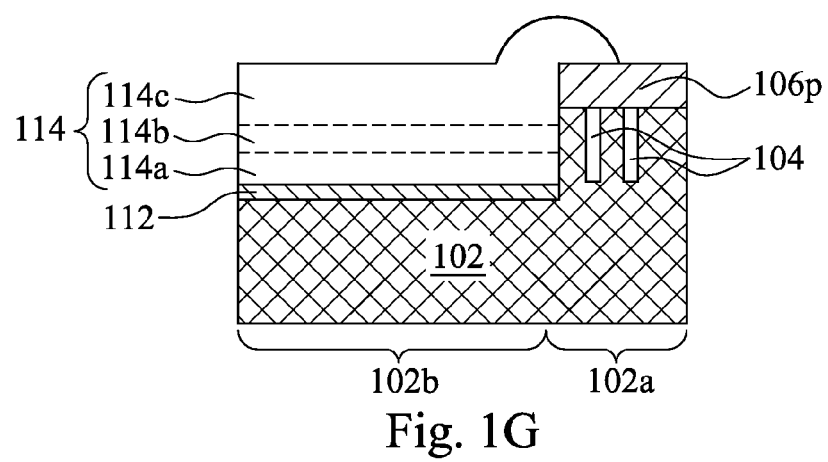
Figure 1H:
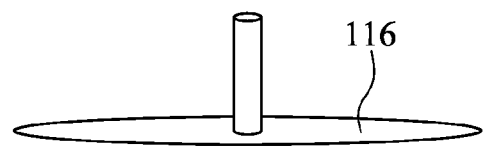
Figure 1H:
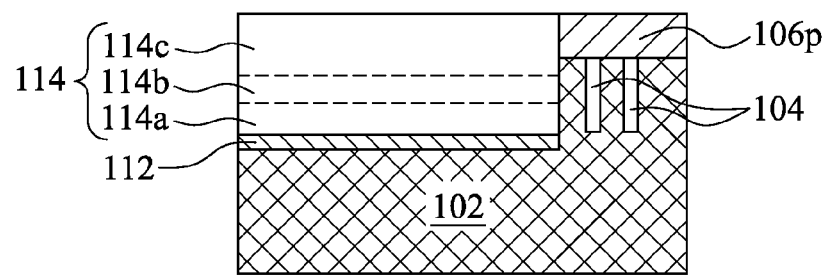
Figure 1I:
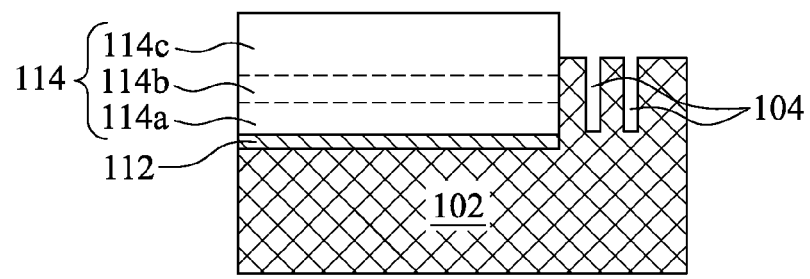
Figure 1J:
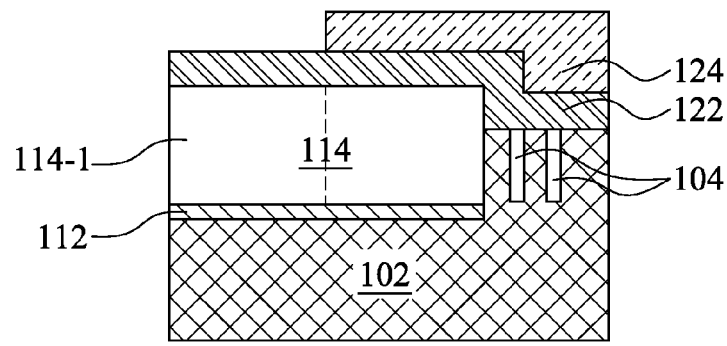
Figure 1K:
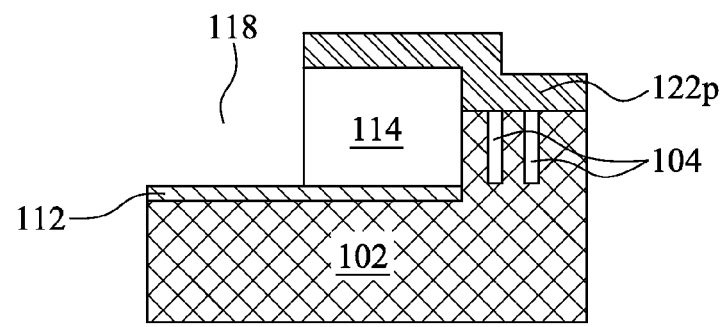
Figure 1L:
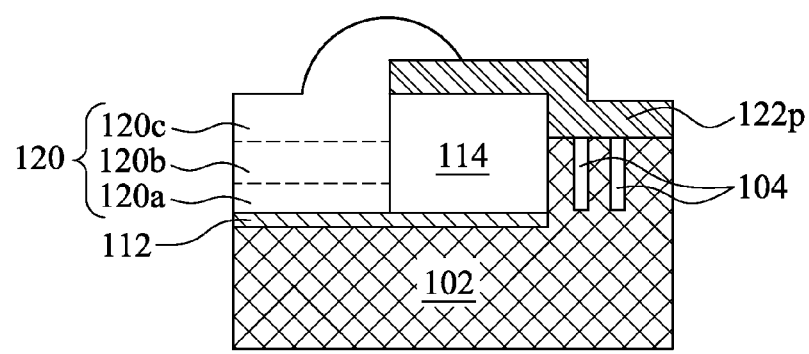
Figure 1M:
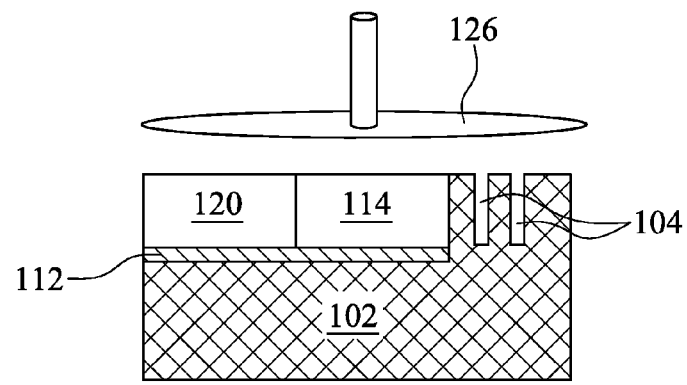
Figure 1N:
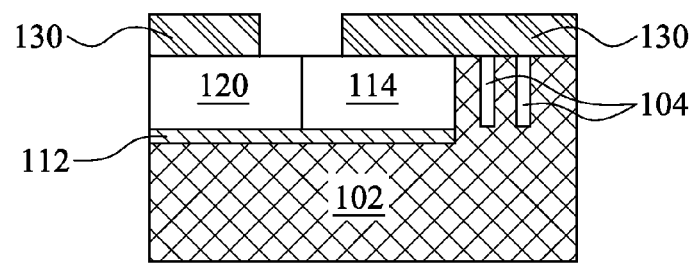
Figure 1O:
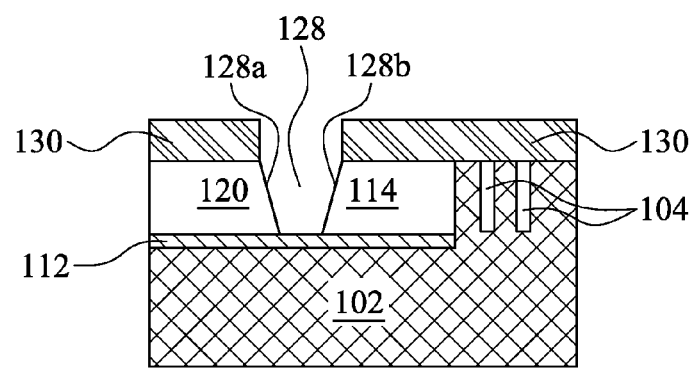
Figure 1P:
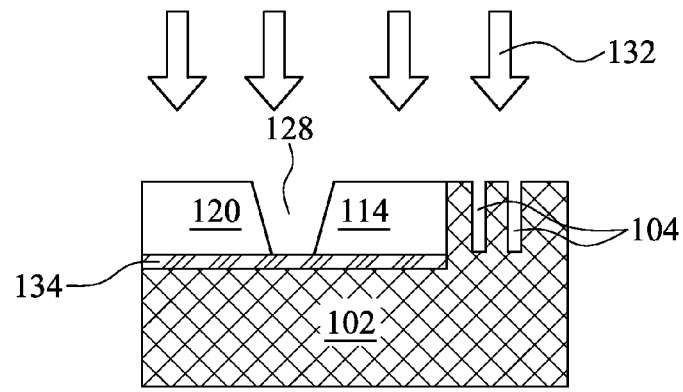
Figure 1Q:
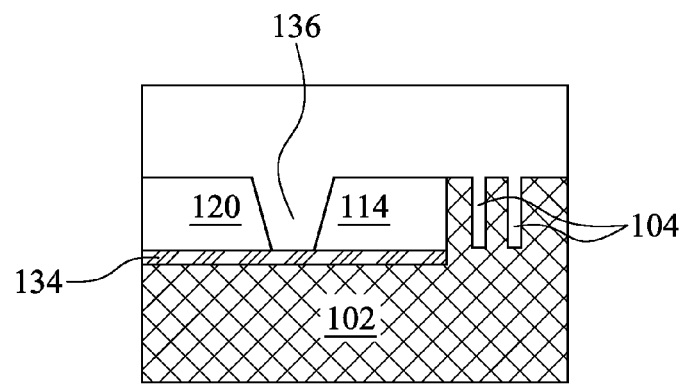
Figure 1R:
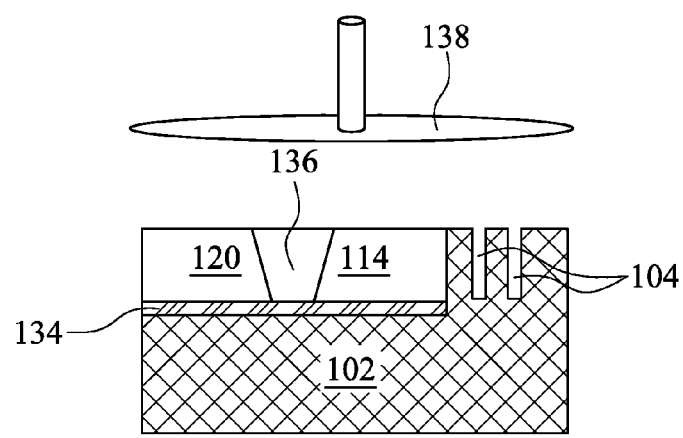
Figure 1S:
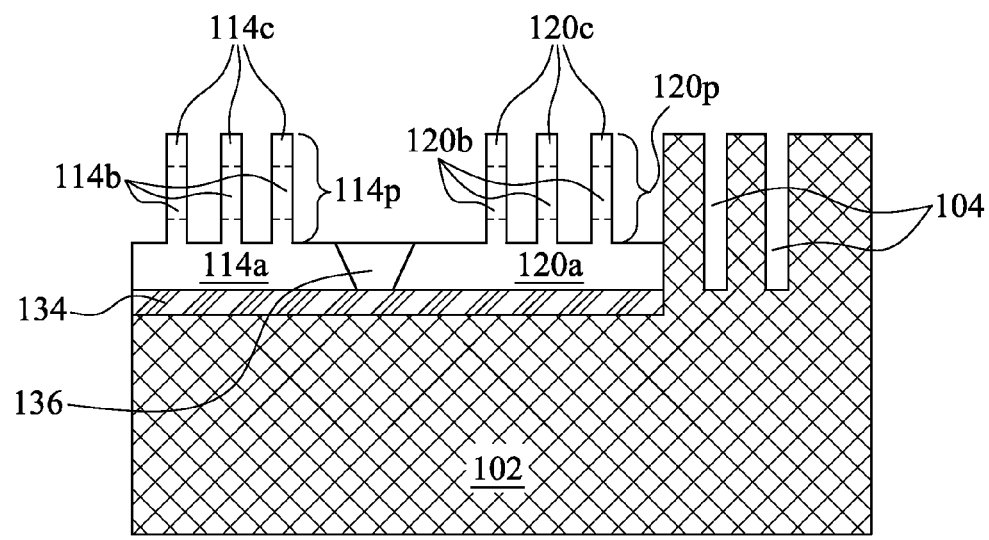
Figure 1T:
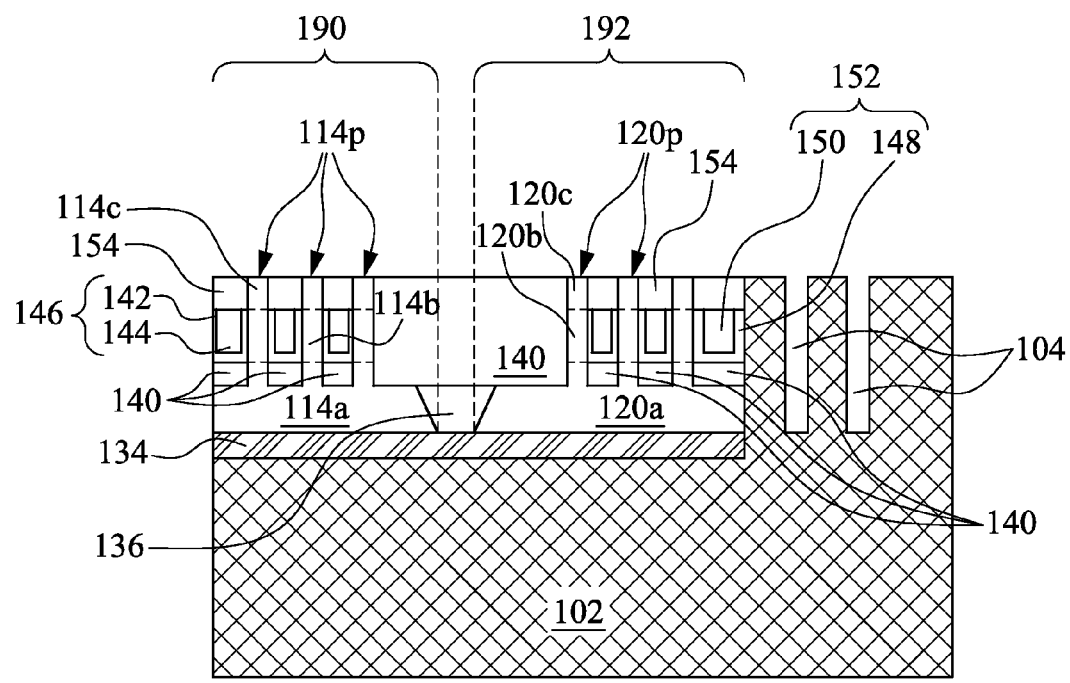

FIGS. 1A to 1T show a process flow illustrating various intermediary stages of manufacturing a semiconductor device having a first vertical gate all around (VGAA) device 190 (shown in FIG. 1T) and a second VGAA device 192 (also shown in FIG. 1T), in accordance with one or more embodiments. FIG. 1A shows a semiconductor substrate 102 in which the first VGAA device 190 and the second VGAA device 192 are to be formed. The semiconductor substrate 102 may be a semiconductor wafer and may comprise silicon (Si); germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The semiconductor substrate 102 may be a bulk semiconductor substrate, a semiconductor-on-insulator (SOI) substrate, a multi-layered or gradient semiconductor substrate, or the like.

Referring to FIG. 1B, one or more alignment marks 104 may be formed in the semiconductor substrate 102 (e.g. in a first region 102a of the semiconductor substrate 102). Only two alignment marks 104 are shown as an example; however, the number of alignment marks 104 may be less than two (e.g. one) or more than two (e.g. three, four, five, or more). The one or more alignment marks 104 may be a feature that may be used to ensure that the semiconductor substrate 102 is aligned in a particular fashion or orientation during further processing steps (e.g. the processing steps shown in FIGS. 1C to 1T). The one or more alignment marks 104 may be formed by patterning one or more trenches into the first region 102a of the semiconductor substrate 102 using, for example, a masking and etching process (e.g. a lithographic masking followed by a dry or wet etch process). However, other suitable processes for forming the one or more alignment marks 104 in the first region 102a of the semiconductor substrate 102 may also be used. In the example shown in FIG. 1B, the one or more trenches formed in the semiconductor substrate 102 define the one or more alignment marks 104. However, in another embodiment, the one or more trenches formed in the first region 102a semiconductor substrate 102 may subsequently be filled with an insulating material (e.g. silicon dioxide). In such an embodiment, a top surface of the insulating material may be substantially co-planar with a top surface of the semiconductor substrate 102. In this embodiment, the one or more alignment marks 104 comprise the one or more trenches and the insulating material formed therein.

As shown in FIG. 1B, the semiconductor substrate 102 may have a second region 102b laterally adjacent to the first region 102a. The first region 102a and the second region 102b of the semiconductor substrate 102 may be non-overlapping regions of the semiconductor substrate 102. In an embodiment, the first VGAA device 190 and the second VGAA device 192 may be formed in the second region 102b of the semiconductor substrate 102. Once the one or more alignment marks 104 have been formed within the semiconductor substrate 102, a portion (e.g. an upper portion) of the second region 102b of the semiconductor substrate 102 may be removed, e.g. in order to provide space within the semiconductor substrate 102 to form the first VGAA device 190 and the second VGAA device 192. The process of removing a portion of the second region 102b of the semiconductor substrate 102 is shown in the examples of FIGS. 1C to 1E where a masking and etching process is used. However, other suitable methods of removing a portion of the second region 102b of the semiconductor substrate 102 may be utilized in other embodiments.

As shown in FIG. 1C, a first hard mask 106 may initially be formed over the semiconductor substrate 102 having the one or more alignment marks 104 formed therein. The first hard mask 106 may completely cover the first region 102a and the second region 102b of the semiconductor substrate 102. The first hard mask 106 may be formed using a suitable process such as chemical vapor deposition, plasma enhanced chemical vapor deposition, atomic layer deposition, or the like. However, other suitable methods of forming the first hard mask 106 over the semiconductor substrate 102 may be utilized. In an embodiment, the first hard mask 106 comprises a dielectric material such as silicon nitride, titanium nitride, silicon oxynitride, combinations thereof, or the like. However, it should be understood that the first hard mask 106 may comprise other suitable materials. The first hard mask 106 may be formed to a thickness of between about 200 Å and about 3000 Å, such as about 500 Å.

Once the first hard mask 106 has been formed over the semiconductor substrate 102, a portion of the first hard mask 106 may be removed in order to expose the second region 102b of the semiconductor substrate 102. In other words, the first hard mask 106 may be patterned to expose the second region 102b of the semiconductor substrate 102. As shown in the example of FIG. 1D, the first hard mask 106 may be patterned by initially forming a patterned first photoresist 108 over the first hard mask 106. The patterned first photoresist 108 may be disposed over the first region 102a of the semiconductor substrate 102 (e.g. the region of the semiconductor substrate 102 in which the one or more alignment marks 104 are formed), while no portion of the patterned first photoresist 108 overlies the second region 102b of the semiconductor substrate 102. The patterned first photoresist 108 may be formed by depositing a first photoresist over the first hard mask 106 and subsequently patterning the first photoresist to yield the patterned first photoresist 108. The first photoresist may comprise one or more suitable photosensitive materials and may be deposited over the first hard mask 106 using spin-on coating, chemical vapor deposition, plasma enhanced chemical vapor deposition, atomic layer deposition, or the like. The first photoresist may be patterned using, for example, a lithographic process (e.g. a photolithographic process).

Following the formation of the patterned first photoresist 108 over the first hard mask 106, the first hard mask 106 may be patterned using the patterned first photoresist 108 as a mask. In other words, the portion of the first hard mask 106 disposed over the second region 102b of the semiconductor substrate 102 may be removed, while leaving behind the portion of the first hard mask 106 disposed over the first region 102a of the semiconductor substrate 102. The result of this processing step is a patterned first hard mask 106p, shown in FIG. 1E. In an embodiment, an etching process (e.g. a reactive ion etching process) may be used to pattern the first hard mask 106. However, other suitable processes for patterning the first hard mask 106 may also be used. The patterning of the first hard mask 106 may continue until the second region 102b of the semiconductor substrate 102 is exposed. Following this, the patterned first photoresist 108 may be removed using, for example, a stripping process (e.g. a wet strip process) or an ashing process (e.g. plasma ashing process).

Thereafter, as shown in FIG. 1E, the pattern of the patterned first hard mask 106p may be transferred to the semiconductor substrate 102 using a suitable etching process, e.g. a reactive ion etching process that utilizes etchants suitable for the material of the semiconductor substrate 102 (e.g. silicon). In other words, the semiconductor substrate 102 may be patterned using the patterned first hard mask 106p as a mask. In an embodiment, a portion (e.g. an upper portion) of the second region 102b of the semiconductor substrate 102 may be removed, thereby forming a first opening 110 in the second region 102b of the semiconductor substrate 102. The first opening 110 may have a depth of between about 50 nm and about 300 nm, such as about 160 nm.

After forming the first opening 110 in the second region 102b of the semiconductor substrate 102, a semiconductive layer 112 may be selectively formed over a bottom surface of the first opening 110, as shown in FIG. 1F. In other words, the semiconductive layer 112 may be formed over the bottom surface of the first opening 110, while sidewalls of the first opening 110 are substantially free from the semiconductive layer 112. The semiconductive layer 112 differs in composition from the semiconductor substrate 102 and may, as an example, comprise SiGex having a high Ge concentration. The semiconductive layer 112 may be formed using an epitaxy process, such as metal-organic (MO) chemical vapor deposition (CVD), molecular beam epitaxy (MBE), liquid phase epitaxy (LPE), vapor phase epitaxy (VPE), selective epitaxial growth (SEG), combinations thereof, and the like. The semiconductive layer 112 may be at least 1 nanometer in thickness and may comprise an alloy semiconductor, as an example.

In a later processing step (e.g. shown in FIG. 1P), the semiconductive layer 112 may be subjected to an annealing or oxidation process, thereby converting the semiconductive layer 112 into an amorphous and/or non-conductive layer (e.g. shown in FIG. 1P as oxidized isolation layer 134) that may serve to reduce or substantially eliminate leakage current between the first VGAA device 190 and the second VGAA device 192, which are subsequently formed over the semiconductive layer 112 in the second region 102b of the semiconductor substrate 102. This effect may be achieved by choosing an appropriate material for the semiconductive layer 112. For example, the material of the semiconductive layer 112 may be chosen such that there is a lattice mismatch between material of the semiconductive layer 112 and material of the semiconductor substrate 102. In other words, the material of the semiconductive layer 112 may have a first lattice constant and the material of the semiconductor substrate 102 may be a second lattice constant that is different from the first lattice constant. In an embodiment, the first lattice constant and the second lattice constant may differ by at least 1 percent (e.g. in a range from about 5 percent to about 35 percent). As an example, if the semiconductor substrate 102 comprises silicon (Si), then the semiconductive layer 112 may comprise silicon-germanium (SiGe$_x$), with concentrations of Ge being greater than or equal to about 20%, e.g. greater than or equal to about 40%. As an another example, if the semiconductor substrate 102 comprises germanium (Ge), then the semiconductive layer 112 may comprise silicon-germanium (SiGe$_x$), with concentrations of Ge being lower than or equal to about 80%, e.g. lower than or equal to about 60%. By selecting the material of the semiconductive layer 112 such that there is a sufficiently large lattice mismatch between material of the semiconductive layer 112 and material of the semiconductor substrate 102, a defect-rich interface is formed between the semiconductive layer 112 and the underlying semiconductor substrate 102. This poor interface, in turn, allows for easy oxidation of the semiconductive layer 112 in a later processing step (e.g. shown in FIG. 1P), thereby enabling the formation of an amorphous and/or non-conductive layer that can provide electrical isolation between the semiconductor substrate 102 and the first VGAA device 190 and between the semiconductor substrate 102 and the second VGAA 192 device. This, in turn, reduces or prevents leakage current between the first VGAA device 190 and the second VGAA device 192.

As shown in FIG. 1G, after the semiconductive layer 112 has been formed on the bottom surface of the first opening 110, the first opening 110 may be filled with semiconductor material to form a first doped region 114. In an embodiment, at least a portion of the first doped region 114 may be used to form the first VGAA device 190. The first doped region 114 may be a multi-layer semiconductor substrate comprising a source layer 114a, a channel layer 114b, and a drain layer 114c. In a particular embodiment, at least a portion of the source layer 114a, the channel layer 114b, and the drain layer 114c of the first doped region 114 are utilized to form the source, channel, and drain regions of the first VGAA device 190, respectively.

The source layer 114a and the drain layer 114c of the first doped region 114 may comprise a semiconductor material that also comprises dopants that causes the source layer 114a and the drain layer 114c of the first doped region 114 to have a first conductivity. On the other hand, the channel layer 114b of the first doped region 114 may comprise a semiconductor material that comprises dopants that causes the channel layer 114b of the first doped region 114 to have a second conductivity that is different from the first conductivity.

As an example, the source layer 114a, the channel layer 114b, and the drain layer 114c of the first doped region 114 may comprise any suitable semiconductor material, such as silicon, germanium, silicon germanium, combinations of these, or the like. For example, in an embodiment, each of the source layer 114a and the drain layer 114c comprises doped silicon, while the channel layer 114b comprises undoped (or unintentionally doped) silicon. However, in another embodiment, the channel layer 114b may comprise doped silicon, while the source layer 114a and the drain layer 114c comprise doped silicon germanium. In an embodiment in which the first VGAA device 190 is an NMOS VGAA device, the source layer 114a and the drain layer 114c of the first doped region 114 may be doped with N-type dopants such as phosphorous or arsenic, while the channel layer 114b of the first doped region 114 may be doped with P-type dopants such as boron or gallium. Alternatively, in an embodiment in which the first VGAA device 190 is a PMOS VGAA device, the source layer 114a and the drain layer 114c of the first doped region 114 may be doped with P-type dopants, while the channel layer 114b of the first doped region 114 may be doped with N-type dopants.

In an embodiment, the dopant concentration of the source layer 114a and the drain layer 114c of the first doped region 114 may be greater than the dopant concentration of the channel layer 114b. For example, the dopant concentration of the source layer 114a and the drain layer 114c of the first doped region 114 may be in a range from about $1 \times 10^{21}$ cm$^{-3}$ to about $1 \times 10^{22}$ cm$^{-3}$ or even greater, while the dopant concentration of the channel layer 114b may be less than about $1 \times 10^{18}$ cm$^{-3}$.

The first doped region 114 may be formed using an epitaxial growth process that utilizes exposed regions of the semiconductive layer 112 as a growth initiator. For example, in some embodiments, the epitaxial growth process may be molecular beam epitaxy (MBE), liquid phase epitaxy (LPE), vapor phase epitaxy (VPE), selective epitaxial growth (SEG), or combinations thereof. Other epitaxial growth processes may also be possible. Since the first doped region 114 is epitaxially grown on the exposed portions of the semiconductive layer 112, growth of the first doped region 114 may not be initiated over the first hard mask 106. In an embodiment, the same epitaxial growth process may be used to form each of the source layer 114a, the channel layer 114b, and the drain layer 114c of the first doped region 114. However, in another embodiment, different epitaxial growth processes may be used to form the source layer 114a, the channel layer 114b, and the drain layer 114c of the first doped region 114.

In an embodiment, the dopants are introduced into the semiconductor material of the source layer 114a, the channel layer 114b, and the drain layer 114c of the first doped region 114 as each layer is grown. As an example, during the epitaxial growth process of the source layer 114a, precursors that comprise the desired dopants are placed in situ into the reaction vessel along with the precursor reactants for the semiconductor material of the source layer 114a. As such, the dopants are introduced and incorporated into the semiconductor material of the source layer 114a to provide the source layer 114a the desired conductivity while the source layer 114a is grown. Although the example presented above is directed to the source layer 114a, a similar process may be used to introduce dopants into the semiconductor material of the channel layer 114b and the drain layer 114c as each layer is grown.

Alternatively, in another embodiment, the dopants may be introduced into the semiconductor material of the source layer 114a, the channel layer 114b, and the drain layer 114c of the first doped region 114 after each layer is grown. As an example, the semiconductor material of the source layer 114a may be grown without the dopants, and an introduction process such as an implantation process or diffusion process is utilized to introduce the dopants into the source layer 114a after growing the source layer 114a, but before growing the channel layer 114b. Once the dopants have been introduced into the source layer 114a, an anneal process may be performed to activate the dopants. Thereafter, the epitaxial growth of the channel layer 114b may be commenced.

Although the example presented above is directed to the source layer 114a, a similar process may be used to introduce dopants into the semiconductor material of the channel layer 114b and the drain layer 114c after each layer is grown.

The epitaxial growth of the source layer 114a, the channel layer 114b, and the drain layer 114c of the first doped region 114 may be continued at least until the first opening 110 has been filled with the material of the first doped region 114. Additionally, to ensure a complete filling of the first opening 110, the growth process may be continued to overfill the first opening 110, as shown in the example of FIG. 1G. Such an overfilling can result in the growth of the first doped region 114 to also proceed laterally (e.g. parallel with the top surface of the semiconductor substrate 102) such that an extension of the first doped region 114 partially extends over a portion of the patterned first hard mask 106p.

FIG. 1H illustrates a first planarization process 116, which may be utilized to planarize the first doped region 114 and to expose the surface of the patterned first hard mask 106. In other words, the first planarization process 116 may remove the portion of the first doped region 114 that partially extends over the patterned first hard mask 106p. In so doing, a top surface of the first doped region 114 may be substantially co-planar with a top surface of the patterned first hard mask 106p. The first planarization process 116 may be a chemical mechanical polish (CMP) or an etch back process, or any other suitable process for planarizing the first doped region 114.

Thereafter, as shown in FIG. 1I, the patterned first hard mask 106p may be removed from over the first region 102a of the semiconductor substrate 102 (e.g. from over one or more alignment marks 104). This may be achieved by a stripping process (e.g. a wet strip process) or an ashing process (e.g. plasma ashing process) that leaves the first doped region 114 substantially unperturbed.

Following this, a portion 114-1 of the first doped region 114 may be removed, e.g. in order to provide space to form the second VGAA device 192. As shown in FIG. 1J, the portion 114-1 of the first doped region 114 is the portion of the first doped region 114 disposed opposite the one or more alignment marks 104. The steps for removing the portion 114-1 of the first doped region 114 are shown in the examples of FIGS. 1J and 1K where a masking and etching process is used. However, it should be understood that other suitable methods of removing the portion 114-1 of the first doped region 114 may be utilized in other embodiments.

As shown in FIG. 1J, a second hard mask 122 may initially be formed over the first doped region 114 and the one or more alignment marks 104. In other words, the second hard mask 122 may completely cover the one or more alignment marks 104 and the first doped region 114. The second hard mask 122 may be formed using similar processes as described above in respect of the first hard mask 106. Furthermore, the second hard mask 122 may comprise similar materials as described above in respect of the first hard mask 106. The second hard mask 122 may be formed to a thickness of between about 200 Å and about 3000 Å, such as about 500 Å.

Once the second hard mask 122 has been formed over the first doped region 114 and the one or more alignment marks 104, a portion of the second hard mask 122 may be removed in order to expose the portion 114-1 of the first doped region 114. For example, the portion of the second hard mask 122 disposed over the portion 114-1 of the first doped region 114 may be removed. In other words, the second hard mask 122 may be patterned to expose the portion 114-1 of the first doped region 114. As illustrated in FIG. 1J, the second hard mask 122 may be patterned by initially forming a patterned second photoresist 124 over the second hard mask 122. The patterned second photoresist 124 may be disposed over a portion of the second hard mask 122 such that no portion of the patterned second photoresist 124 overlies the portion 114a of the first doped region 114. The patterned second photoresist 124 may be formed and patterned using similar processes as described above in respect of the patterned first photoresist 108.

Following the formation of the patterned second photoresist 124, the second hard mask 122 may be patterned using the patterned second photoresist 124 as a mask to yield a patterned second hard mask 122p (shown in FIG. 1K). In an embodiment, an etching process (e.g. a reactive ion etching process) may be used to pattern the second hard mask 122. However, other suitable processes for patterning the second hard mask 122 may also be used. The patterning of the second hard mask 122 may continue until the portion 114-1 of the first doped region 114 is exposed. Following this, the patterned second photoresist 124 may be removed using, for example, a stripping process (e.g. a wet strip process) or an ashing process (e.g. plasma ashing process).

Thereafter, as shown in FIG. 1K, the pattern of the patterned second hard mask 122p may be transferred to the semiconductor substrate 102 and the first doped region 114 using a suitable etching process, e.g. a reactive ion etching process that utilizes etchants suitable for the material of the semiconductor substrate 102 (e.g. silicon). In other words, the portion 114-1 of the first doped region 114 may be removed, thereby forming a second opening 118 that exposes the semiconductive layer 112. The second opening 118 may have a depth of between about 50 nm and about 300 nm, such as about 160 nm.

Thereafter, as shown in FIG. 1L, the second opening 118 may be filled with semiconductor material to form a second doped region 120. In an embodiment, at least a portion of the second doped region 120 is used to form the second VGAA device 192. The second doped region 120 may be a multi-layer semiconductor substrate comprising a source layer 120a, a channel layer 120b, and a drain layer 120c. In a particular embodiment, at least a portion of the source layer 120a, the channel layer 120b, and the drain layer 120c of the second doped region 120 may be utilized to form the source, channel, and drain regions of the second VGAA device 192, respectively.

The source layer 120a and the drain layer 120c of the second doped region 120 may have the second conductivity opposite from the first conductivity of the source layer 114a and the drain layer 114c of the first doped region 114. For example, if the source layer 114a and the drain layer 114c of the first doped region 114 comprises N-type dopants, then the source layer 120a and the drain layer 120c of the second doped region 120 comprises P-type dopants. As another example, if the source layer 114a and the drain layer 114c of the first doped region 114 comprises P-type dopants, then the source layer 120a and the drain layer 120c of the second doped region 120 comprises N-type dopants. The second doped region 120 may comprise a semiconductor material similar to those described above in respect of the first doped region 114. The source layer 120a, the channel layer 120b, and the drain layer 120c of the second doped region 120 may be formed and doped using similar processes described above in respect of the first doped region 114. The formation of the second doped region 120 may be continued at least until the second opening 118 has been filled. Additionally, to ensure a complete filling of the second opening 118, the second doped region 120 may overfill the second opening

120, as shown in FIG. 1L. Such an overfilling can result in the second doped region 120 partially extending over the patterned second hard mask 122*p*, as shown in FIG. 1L.

FIG. 1M illustrates a second planarization process 126, which is utilized to planarize the first doped region 114, the second doped region 120, and the patterned second hard mask 122*p*, e.g. to expose the one or more alignments marks 104. In other words, the second planarization process 126 may remove the patterned second hard mask 122*p* as well as portions of the first doped region 114 and the second doped region 120. As shown in FIG. 1M, the top surfaces of the first doped region 114 the second doped region 120 may be substantially co-planar with the top surface of the semiconductor substrate 102 as a result of the second planarization process 126. The second planarization process 126 may be a similar process as described above in respect of the first planarization process 116.

FIGS. 1N and 1O show the formation of a recess 128 (shown in FIG. 1O) using a masking and etching process. However, it should be understood that other suitable methods of forming the recess 128 may be utilized in other embodiments. The recess 128 may, as an example, serve to physically isolate the first doped region 114 and the second doped region 120 from each other. The embodiments shown in FIGS. 1N and 1O show the recess 128 formed in a portion of the first doped region 114 and a portion of the second doped region 120, where a first sidewall 128*a* of the recess 128 is defined by a sidewall of the first doped region 114 and a second sidewall 128*b* of the recess 128 is defined by a sidewall of the second doped region 120. The recess 128 may expose a portion of the semiconductive layer 112, as illustrated in FIG. 1O.

As shown in FIG. 1N, a patterned third photoresist 130 may be formed over the first doped region 114, the second doped region 120, and the one or more alignment marks 104, e.g. using one or more of the processes described above in respect of formation of the patterned first photoresist 108. The patterned third photoresist 130 may comprise similar materials as described above in respect of the patterned first photoresist 108. The patterned third photoresist 130 may be used as a mask to form the recess 128 that exposes a portion of the semiconductive layer 112. The recess 128 may be formed using similar processes described above in respect of the first opening 110. After forming the recess 128, the patterned third photoresist 130 may be removed using, for example, a stripping process (e.g. a wet strip process) or an ashing process (e.g. plasma ashing process).

Thereafter, as shown in FIG. 1P, an oxidation process 132 may be performed on the semiconductive layer 112 to form an oxidized isolation layer 134. In general, the oxidized isolation layer 134 may be represented as $Si_xGe_yO_z$ (assuming the isolation layer 120 comprises silicon and germanium). As described above in respect of FIG. 1F, the poor interface caused by the lattice mismatch between material of the semiconductive layer 112 and material of the semiconductor substrate 102 allows for easy oxidation of the semiconductive layer 112. During the oxidation process 132, oxygen flows into the recess 128 and penetrates into an edge region of the semiconductive layer 112. Oxygen contained in the edge region of the semiconductive layer 112 thereafter diffuses into an interior region of the semiconductive layer 112. Consequently, edge regions of the oxidized isolation layer 134 may have a larger thickness than central regions of the oxidized isolation layer 134. This feature of the oxidized isolation layer 134 is shown in greater detail in FIG. 6.

The oxidation process 132 may comprise a plasma process, which may include use of an oxygen ambient plasma. In such an embodiment, the radiofrequency power applied during the plasma process may be in a range from about 300 Watts to about 1500 Watts, while an oxygen flow rate may be in a range from about 50 standard cubic centimeters per minute (sccm) to about 500 sccm. In some embodiments, the oxidation process 132 may include an $O_2$ ambient process and/or an annealing process. The temperature of the oxidation process 132 may be in a range from about 450 degrees Celsius to about 1300 degrees Celsius. This range of temperatures may be achieved in an embodiment when the oxidation process 132 is a spike annealing process, e.g. performed for a duration in a range from about 1 second to about 10 seconds. As another example, these temperatures may be also be achieved when the oxidation process 132 is a soak annealing process, e.g. performed for a duration of at least about 30 seconds. By way of another example, the oxidation process 132 may include placing the structure shown in FIG. 1P in a furnace for at least about 1 hour to reach a temperature in a range from about 450 degrees Celsius to about 1300 degrees Celsius.

As shown in FIG. 1Q, following the formation of the oxidized isolation layer 134, the recess 128 may be filled with an insulating material to form an isolation feature 136 (e.g. shallow-trench isolation (STI) feature). In order to ensure complete filling of the recess 128, the material of the isolation feature 136 may overfill the recess 128 such that top surfaces of the first doped region 114, the second doped region 120 and the one or more alignment marks 104 are also covered by the isolation feature 136, as shown in FIG. 1Q. The insulating material may comprise a dielectric material (e.g. silicon oxide or the like). In some embodiments, the insulating material may be formed in the recess 128 using a HPD-CVD process, using silane ($SiH_4$) and oxygen ($O_2$) as reacting precursors. In other embodiments, isolation feature 136 may be formed using a sub-atmospheric CVD (SACVD) process or high aspect-ratio process (HARP), wherein process gases may comprise tetraethylorthosilicate (TEOS) and ozone ($O_3$). In yet other embodiments, isolation feature 136 may be formed using a spin-on-dielectric (SOD) process, such as hydrogen silsesquioxane (HSQ) or methyl silsesquioxane (MSQ). An anneal process (e.g. rapid thermal anneal process) or another suitable process may be performed to cure the material of isolation feature 136. However, it should be understood that other processes and materials may be used in forming the isolation feature 136. In some embodiments, a liner (e.g., a semiconductor nitride/oxide/oxynitride, not illustrated in FIG. 1Q) may be formed on sidewalls and a bottom surface of the recess 128 prior to forming the isolation feature 136. In such an embodiment, the liner may prevent (or at least reduce) the diffusion of material from the first doped region 114 and the second doped region 120 into isolation feature 136 during the curing of the material of the isolation feature 136.

Thereafter, as shown in FIG. 1R, a third planarization process 138 may be used to remove excess insulating material (and liner material, if present) from top surfaces of the semiconductor substrate 102, the first doped region 114, and the second doped region 120. The third planarization process 138 may include similar processes as described above in respect of the first planarization process 116.

Following this, as shown in FIG. 1S, the first doped region 114 may be patterned to form first protrusions 114*p*, while the second doped region 120 may be patterned to form second protrusions 120*p*. The first protrusions 114*p* and the second protrusions 120*p* may include vertical channel regions of the first VGAA device 190 and the second VGAA device 192, respectively. The patterning process used to form the first protrusions 114p and the second protrusions 120p may be a masking and etching process, e.g. similar to that described above in respect of FIGS. 1C to 1E and FIGS. 1J to 1K. The details of the patterning process are omitted for the sake of brevity.

The first protrusions 114p may be formed by etching openings through the first doped region 114 that extend fully through the drain layer 114c and the channel layer 114b of the first doped region 114. However, as shown in FIG. 1S, these openings extend only partially through the source layer 114a of the first doped region 114. In like manner, the second protrusions 120p may be formed by etching openings through the second doped region 120 that extend fully through the drain layer 120c and the channel layer 120b of the second doped region 120, while extending only partially through the source layer 120a of the second doped region 120. In forming the first protrusions 114p and the second protrusions 120p, a portion (e.g. an upper portion) of the isolation feature 136 may also be removed. However, another portion (e.g. a lower portion) of the isolation feature 136 may remain after forming the first protrusions 114p and the second protrusions 120p, and this remaining portion of the isolation feature 136 may be disposed between the source layer 120a of the second doped region 120 and the source layer 114a of the first doped region 114, as shown in FIG. 1S.

In an embodiment, the first protrusions 114p may be nanowires that extend from the source layer 114a of the first doped region 114 away from the semiconductor substrate 102. However, in another embodiment, the first protrusions 114p may be shaped as a bar, e.g. when viewed in a top-down view. In like manner, the second protrusions 120p may be nanowires that extend from the source layer 120a of the second doped region 120 away from the semiconductor substrate 102. However, in another embodiment, the second protrusions 120p may be shaped as a bar, e.g. when viewed in a top-down view. These embodiments are described below in greater detail in respect of FIGS. 5A to 5C.

Following the formation of the first protrusions 114p and the second protrusions 120p, the manufacturing of the first VGAA device 190 and the second VGAA device 192 is continued by forming a first spacer layer 140, a first gate stack 146, a second gate stack 152, and a second spacer layer 154. These features of the first VGAA device 190 and the second VGAA device 192 are shown in FIG. 1T.

The first spacer layer 140 may be formed between adjacent protrusions of the first protrusions 114p and between adjacent protrusions of the second protrusions 120p. The first spacer layer 140 may also disposed between the first protrusions 114p and the second protrusions 120p, e.g. over the remaining portion of the isolation feature 136, as shown in FIG. 1T. The first spacer layer 140 may be used to provide an insulating layer that prevents the subsequently formed first gate stack 146 from electrically contacting the underlying first doped region 114 (e.g. portions of the source layer 114a of the first doped region 114 extending outwards from the first protrusions 114p). The first spacer layer 140 also prevents the subsequently formed second gate stack 152 from contacting the underlying second doped region 120 (e.g. portions of the source layer 120a of the second doped region 120 extending outwards from the second protrusions 120p).

In some embodiments, the first spacer layer 140 may comprise a dielectric material, such as silicon nitride, for example, formed using any suitable process, such as, CVD, ALD, and the like. In some embodiments, the deposition of first spacer layer 140 may be a conformal process. An etch back process may be performed to remove excess portions of first spacer layer 140 from the top surfaces of the first protrusions 114p and the second protrusions 120p, from sidewalls of the drain layers 114c and 120c, and from sidewalls of the channel layers 114b and 120b.

Following the formation of the first spacer layer 140, the first gate stack 146 and the second gate stack 152 may be formed over the first spacer layer 140 between adjacent protrusions of the first protrusions 114p and between adjacent protrusions of the second protrusions 120p, respectively. The first gate stack 146 may encircle all sides of the channel layer 114b of the first protrusions 114p, while the second gate stack 152 may encircle all sides of the channel layer 120b of the second protrusions 120p. The first gate stack 146 may include a conformal first gate dielectric 142 and a first gate electrode 144 formed over first gate dielectric 142. In like manner, the second gate stack 152 may include a conformal second gate dielectric 148 and a second gate electrode 150 formed over second gate dielectric 148.

The first gate dielectric 142 and the second gate dielectric 148 may include silicon oxide, silicon nitride, or multilayers thereof. Additionally or alternatively, the first gate dielectric 142 and the second gate dielectric 148 may include a high-k dielectric material. In such embodiments, first gate dielectric 142 and the second gate dielectric 148 may include a metal oxide or a silicate of hafnium (Hf), aluminum (Al), zirconium (Zr), lanthanum (La), magnesium (Mg), barium (Ba), titanium (Ti), lead (Pb), combinations thereof, and the like. The first gate dielectric 142 and the second gate dielectric 148 may be formed by molecular beam deposition (MBD), ALD, PECVD, and the like.

The first gate electrode 144 and the second gate electrode 150 may include a metal-containing material such as titanium nitride (TiN), tantalum nitride (TaN), tantalum carbon (TaC), cobalt (Co), ruthenium (Ru), aluminum (Al), combinations thereof, multi-layers thereof, and the like. The first gate electrode 144 and the second gate electrode 150 may be formed using a suitable deposition process such as MBD, ALD, PECVD, and the like. An etch back process may be performed to remove excess portions of the first gate stack 146 from top surfaces of the first protrusions 114p and from sidewalls of the drain layer 114c. This etch back process may also remove excess portions of the second gate stack 152 from top surfaces of the second protrusions 120p and from sidewalls of the drain layer 120c.

Following the formation of the first gate stack 146 and the second gate stack 152, a second spacer layer 154 may be deposited over the first gate stack 146 and the second gate stack 152, e.g. using similar processes as described above in respect of the first spacer layer 140. For example, the second spacer layer 154 may be deposited over the first gate stack 146, the second gate stack 152, and top surfaces of the drain layers 114c and 120c. Following this, a planarization process (e.g. a CMP process) may be subsequently applied to expose the top surfaces of the drain layers 114c and 120c. The second spacer layer 154 may include similar materials as the first spacer layer 140. Following this, the drain layers 114c and 120c may be enlarged by using one or more of the epitaxial growth processes that were initially used to form the drain layers 114c and 120c. This step of enlarging the drain layers 114c and 120c is not shown in the process flow for the sake of brevity.

At least a part of the first VGAA device 190 and the second VGAA device 192 may be formed in the semiconductor substrate 102 using the process flow shown in FIGS. 1A to 1T. An advantage provided by the method described above includes provision of an amorphous and/or non-conductive layer (e.g. the oxidized isolation layer 134) that can provide electrical isolation between the semiconductor substrate 102 and the first VGAA device 190 and between the semiconductor substrate 102 and the second VGAA 192 device. This, in turn, reduces or prevents leakage current between the first VGAA device 190 and the second VGAA device 192.

As shown in FIGS. 1A to 1T, in forming the first VGAA device 190 and the second VGAA device 192 in the semiconductor substrate 102, the growth of the first doped region 114 and the second doped region 120 are performed prior to the formation of the recess 128. However, in another embodiment, the recess 128 may be formed in the semiconductor substrate 102 prior to forming the first doped region 114 and the second doped region 120, e.g. in order to separate (e.g. physically separate) regions of the semiconductor substrate 102 in which the first doped region 114 and the second doped region 120 are subsequently formed. Such an embodiment is shown in FIGS. 2A to 2Q.

Figure 2A:
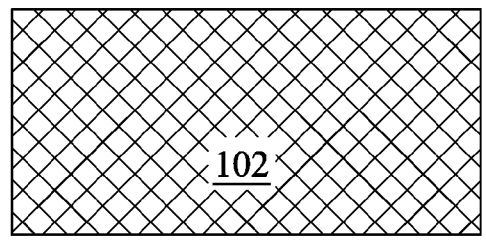
Figure 2B:
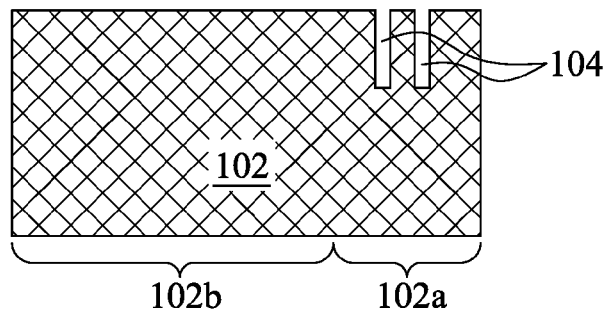
Figure 2C:
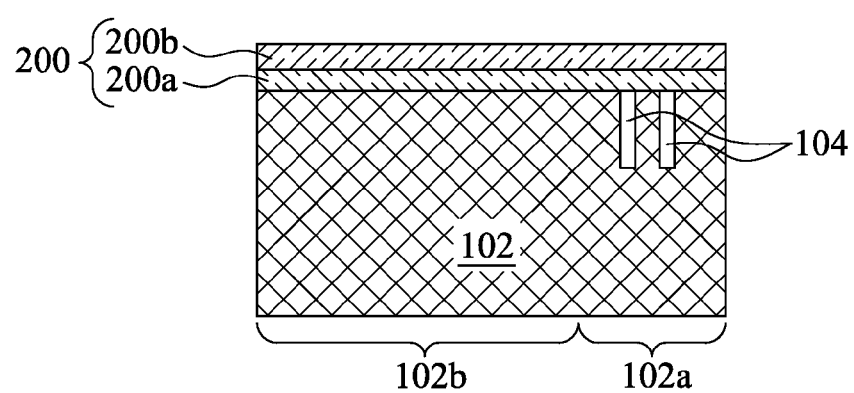

FIG. 2A shows the semiconductor substrate 102, and FIG. 2B shows the one or more alignment marks 104 formed in the semiconductor substrate 102. The one or more alignment marks 104 may be formed using the processes described above in respect of FIG. 1B. As shown in FIG. 2C, a third hard mask 200 comprising a pad oxide layer 200a (e.g. silicon oxide) and a pad nitride layer 200b (e.g., silicon nitride) may be deposited over the semiconductor substrate 102. The third hard mask 200 may cover the one or more alignment marks 104 as well as the second region 102b of the semiconductor substrate 102. The third hard mask 200 may be used to prevent damage to the underlying semiconductor substrate 102 during the formation of the recess 128 (shown in FIG. 2D). The third hard mask 200 may be formed using any suitable deposition process, such as, atomic layer deposition (ALD), CVD, high density plasma CVD (HDP-CVD), physical vapor deposition (PVD), and the like.

Figure 2D:
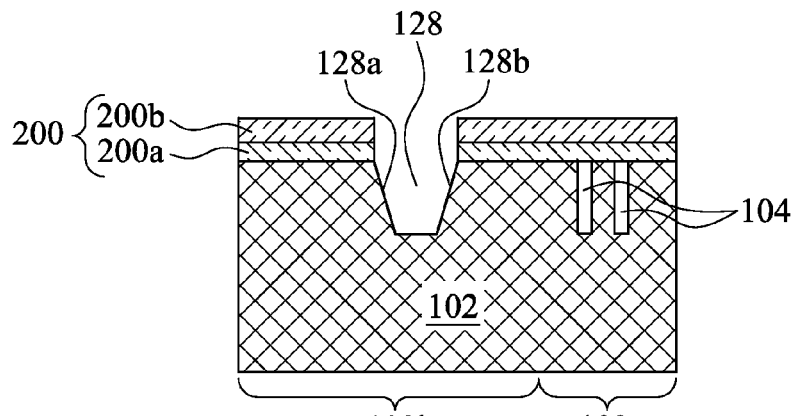

As shown in FIG. 2D, the recess 128 may be formed in the semiconductor substrate 102 (e.g. in the second region 102b of the semiconductor substrate 102) using one or more of the processes described above in relation to FIG. 1O. The recess 128 may extend fully through the third hard mask 200, while extending partially through the semiconductor substrate 102, as shown in FIG. 2D. In the process flow of FIGS. 2A to 2Q, the recess 128 is formed to separate (e.g. physically separate) regions of the semiconductor substrate 102 in which the first doped region 114 and the second doped region 120 are subsequently formed.

Figure 2E:
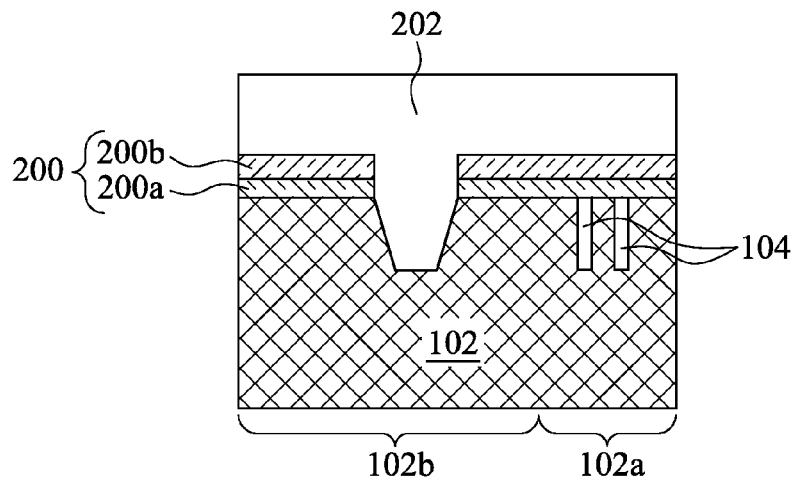

Referring to FIG. 2E, the recess 128 may be filled with an insulating material to form a separation feature 202. In order to ensure complete filling of the recess 128, the material of the separation feature 202 may overfill the recess 128 such that top surfaces of the third hard mask 200 are also covered by material of the separation feature 202, as shown in FIG. 2E. The insulating material may comprise a dielectric material (e.g. silicon oxide or the like). In some embodiments, the insulating material may be formed in the recess 128 using one or more of the processes described above in relation to the isolation feature 136 shown in FIG. 1Q.

Figure 2F:
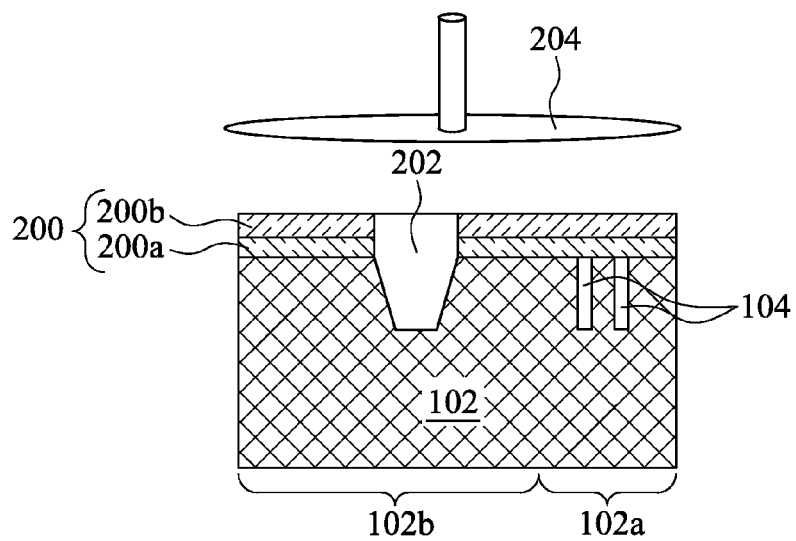
Figure 2G:
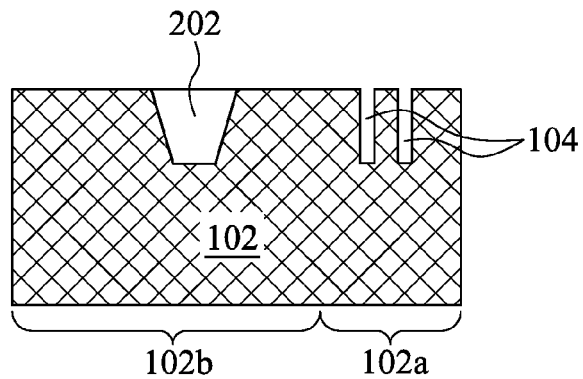

Thereafter, as shown in FIG. 2F, a fourth planarization 204 may be used to remove excess insulating material from top surfaces of the third hard mask 200. The fourth planarization 204 may include similar processes as described above in respect of the first planarization process 116. Referring to FIG. 2G, the third hard mask 200 may be removed using, for example, a stripping process (e.g. a wet strip process) or an ashing process (e.g. plasma ashing process). Furthermore, the separation feature 202 may be planarized using, for example, an etch back process that causes the top surfaces of the semiconductor substrate 102 and the separation feature 202 to be substantially co-planar, as shown in FIG. 2G.

As described above, the separation feature 202 may separate (e.g. physically separate) regions of the semiconductor substrate 102 in which the first doped region 114 and the second doped region 120 are subsequently formed. Consequently, following the formation of the separation feature 202, portions of the semiconductor substrate 102 laterally adjacent to the separation feature 202 may be removed to provide space to form the first doped region 114 and the second doped region 120.

Figure 2H:
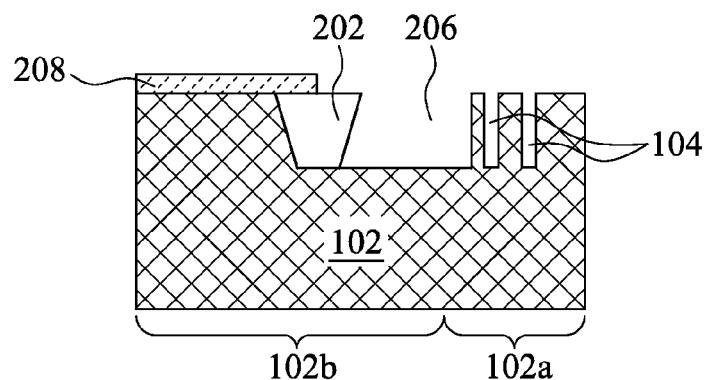

As shown in FIG. 2H, a third opening 206 may be formed in the semiconductor substrate 102 to provide space in the semiconductor substrate 102 to form the semiconductive layer 112 and the first doped region 114. The third opening 206 may be formed in the semiconductor substrate 102 adjacent to the side of the separation feature 202 facing the one or more alignment marks 104. The third opening 206 may be formed using a masking and etching process (e.g. a lithographic masking followed by a dry or wet etch process) using a fourth hard mask 208 as a mask. However, other suitable processes for forming the third opening 206 in the semiconductor substrate 102 may also be used. The fourth hard mask 208 may be formed over the semiconductor substrate 102 and may be patterned using one or more of the processes described above in relation to the first hard mask 106. Furthermore, the fourth hard mask 208 may include similar materials as the first hard mask 106.

Figure 2I:
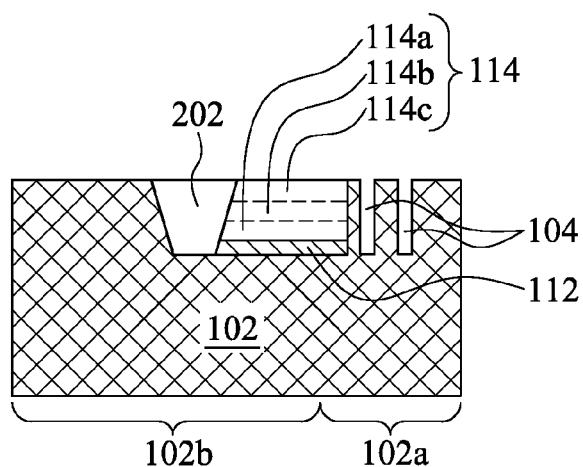

Referring to FIG. 2I, the semiconductive layer 112 may line the bottom surface of the third opening 206 and the first doped region 114 may be formed over the semiconductive layer 112 and may fill the third opening 206. The processes used to form the semiconductive layer 112 and the first doped region 114 in the third opening 206 may be similar to those described above in relation to FIGS. 1F to 1H.

Figure 2J:
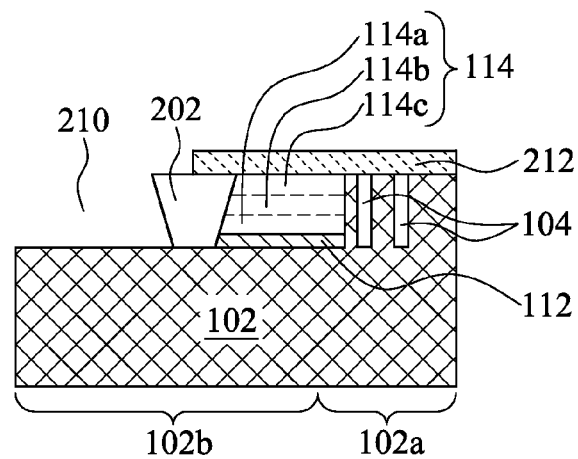

Referring to FIG. 2J, a fourth opening 210 may be formed in the semiconductor substrate 102 to provide space in the semiconductor substrate 102 to form the semiconductive layer 112 and the second doped region 114. The fourth opening 210 may be formed in the semiconductor substrate 102 adjacent to the side of the separation feature 202 facing away from the one or more alignment marks 104. The fourth opening 210 may be formed using a masking and etching process (e.g. a lithographic masking followed by a dry or wet etch process) using a fifth hard mask 212 as a mask. However, other suitable processes for forming the fourth opening 210 in the semiconductor substrate 102 may also be used. The fifth hard mask 212 may be formed over the semiconductor substrate 102 and may be patterned using one or more of the processes described above in relation to the first hard mask 106. Furthermore, the fifth hard mask 212 may include similar materials as the first hard mask 106.

Figure 2K:
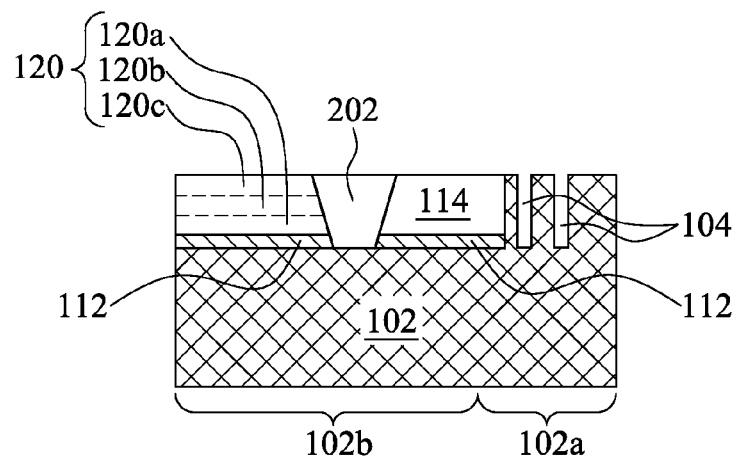

Referring to FIG. 2K, the semiconductive layer 112 may line the bottom surface of the fourth opening 210 and the second doped region 120 may be formed over the semiconductive layer 112 and may fill the fourth opening 210. The process flow steps used to form the semiconductive layer 112 and the second doped region 120 in the fourth opening 210 may be similar to those described above in relation to FIG. 1F and FIGS. 1K to 1M.

Figure 2L:
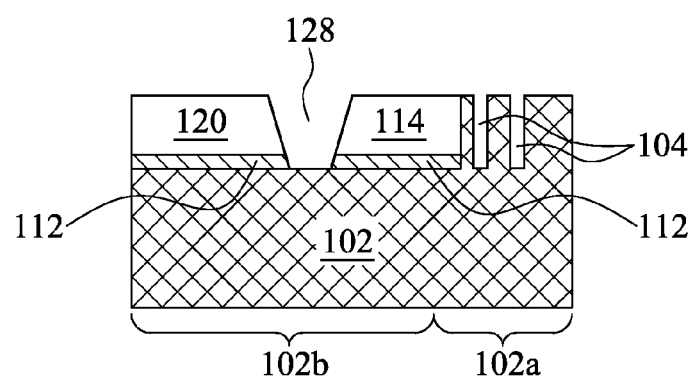
Figure 2M:
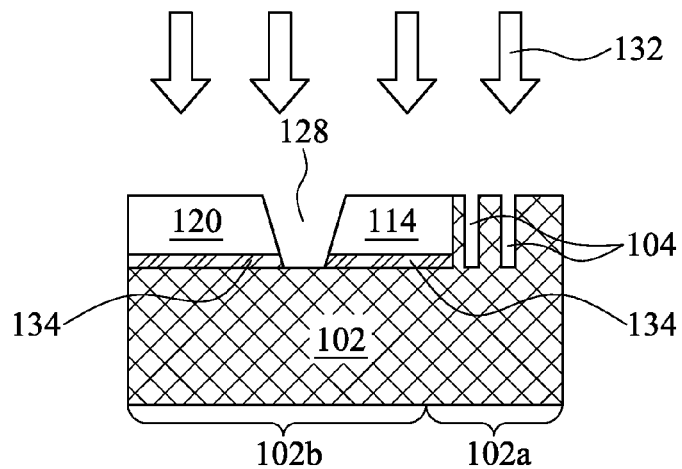
Figure 2N:
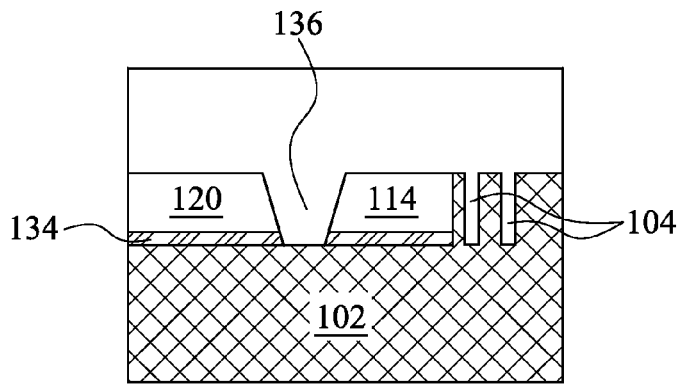
Figure 2O:
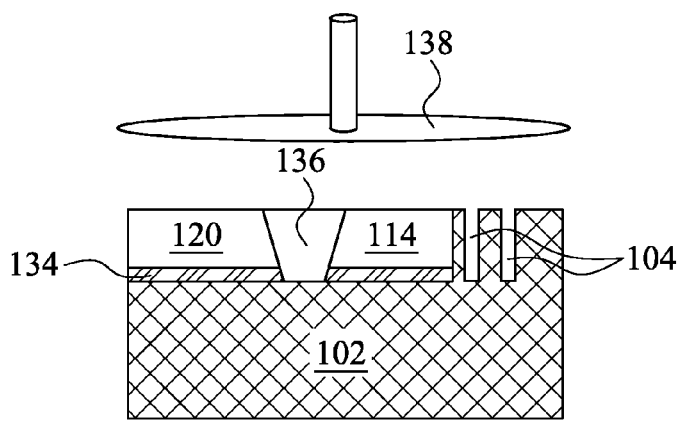
Figure 2P:
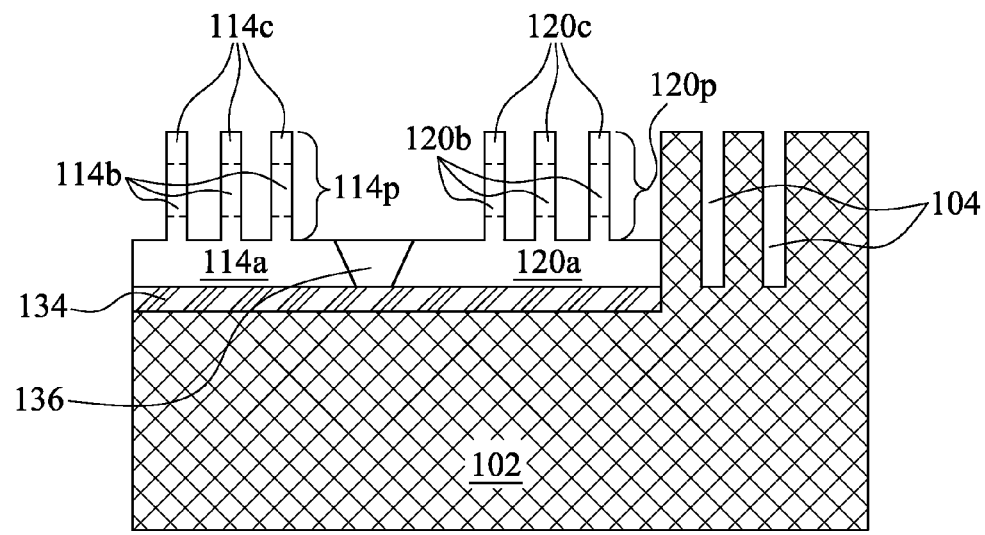
Figure 2Q:
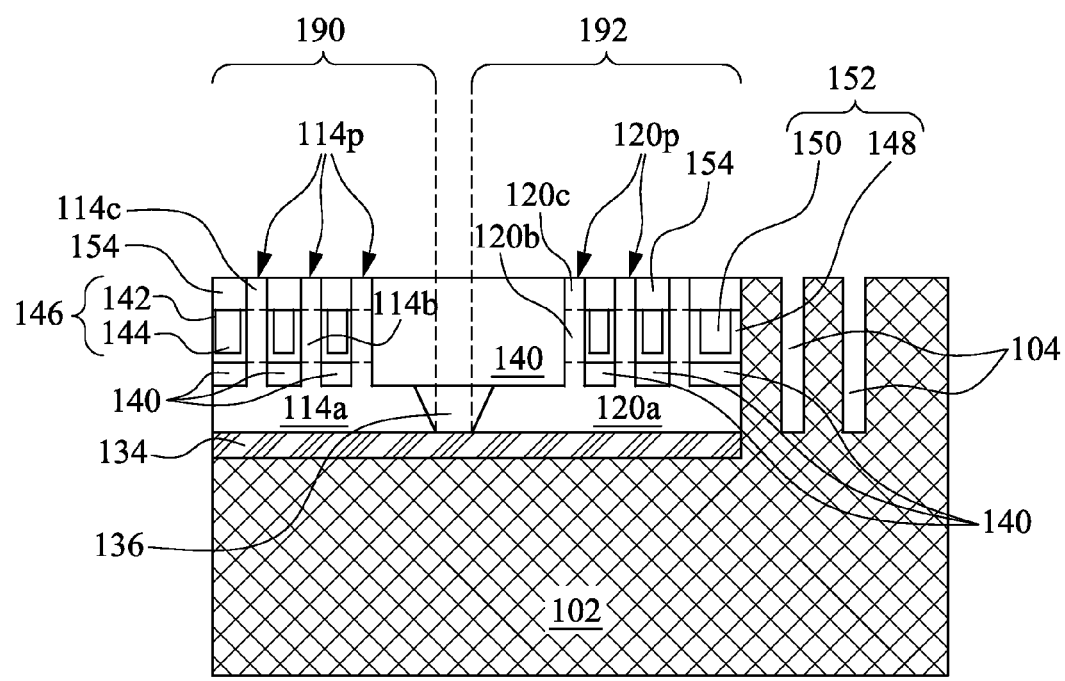

Referring to FIG. 2L, the separation feature 202 that physically separates the first doped region 114 and the second doped region 120 may be removed (e.g. using a dry and/or wet etch process). By removing the separation feature 202, edge regions of the semiconductive layer 112 proximal the recess 128 may be exposed. Thereafter, as shown in FIG. 2M, the oxidation process 132 may be performed on the semiconductive layer 112 to form the oxidized isolation layer 134. The details of the oxidation process 132 are described above in relation to FIG. 1P. Thereafter, as shown in FIGS. 2N to 2Q, the process flow for forming the first VGAA device 190 and the second VGAA device 192 may proceed in a similar manner as described above in relation to FIGS. 1Q to 1T.

At least a part of the first VGAA device 190 and the second VGAA device 192 may be formed in the semiconductor substrate 102 using the process flow shown in FIGS. 2A to 2Q. An advantage provided by the method described above includes provision of an amorphous and/or non-conductive layer (e.g. the oxidized isolation layer 134) that can provide electrical isolation between the semiconductor substrate 102 and the first VGAA device 190 and between the semiconductor substrate 102 and the second VGAA 192 device. This, in turn, reduces or prevents leakage current between the first VGAA device 190 and the second VGAA device 192.

The process flows shown in FIGS. 1A to 1T and FIGS. 2A to 2Q show the formation of the oxidized isolation layer 134 below both the first doped region 114 and the second doped region 120. Consequently, as shown in FIGS. 1T and 2Q, the oxidized isolation layer 134 may be disposed below both the first VGAA device 190 and the second VGAA device 192. In an embodiment where the first VGAA device 190 is an NMOS VGAA device and the second VGAA device 192 is a PMOS VGAA device, it may be possible to form the oxidized isolation layer 134 below the second VGAA device 192 (e.g. the PMOS VGAA device), while no portion of the oxidized isolation layer 134 is disposed below the first VGAA device 190 (e.g. NMOS VGAA device). A process flow illustrating such an embodiment is shown below in FIGS. 3A to 3U.

FIGS. 3A to 3E show the semiconductor substrate 102 and the formation of the one or more alignment marks 104 and the first opening 110 in the first region 102a and the second region 102b of the semiconductor substrate 102, respectively. The process flow may proceed in a similar manner as described above in respect of FIGS. 1A to 1E.

Figure 3A:
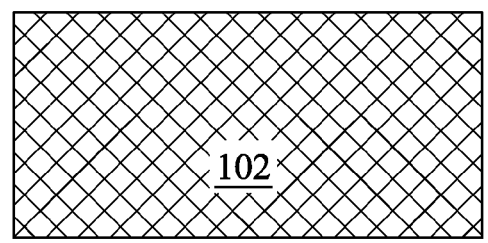
FIGS. 3A to 3U and 4A to 4R show process flows illustrating various intermediary steps of manufacturing a semiconductor device having a first VGAA device and a second VGAA device where an oxidized isolation layer is formed beneath the second VGAA device, in accordance with one or more embodiments.
Figure 3B:
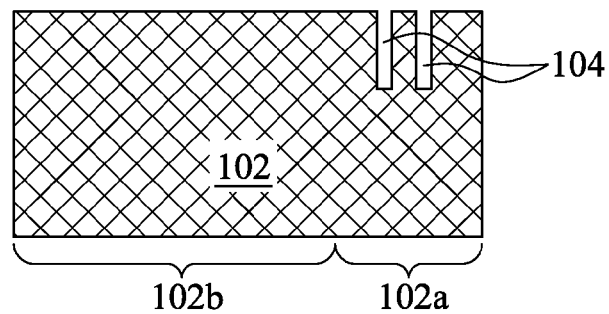
Figure 3C:
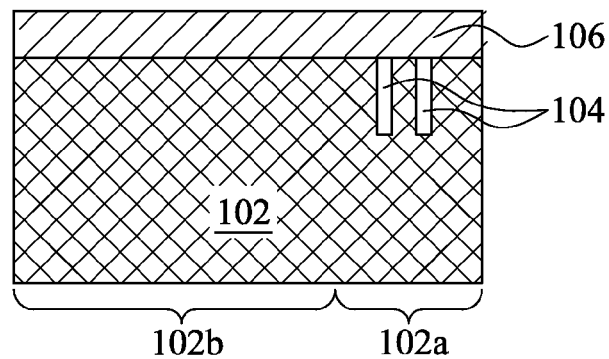
Figure 3D:
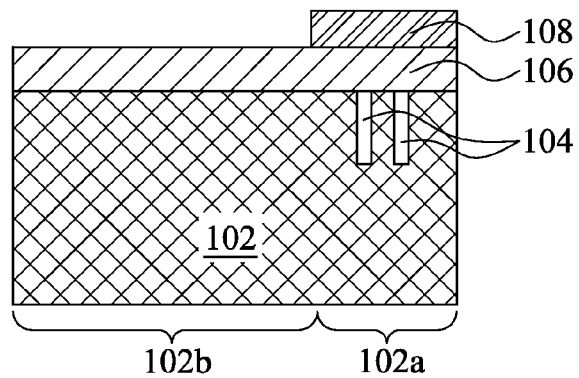
Figure 3E:
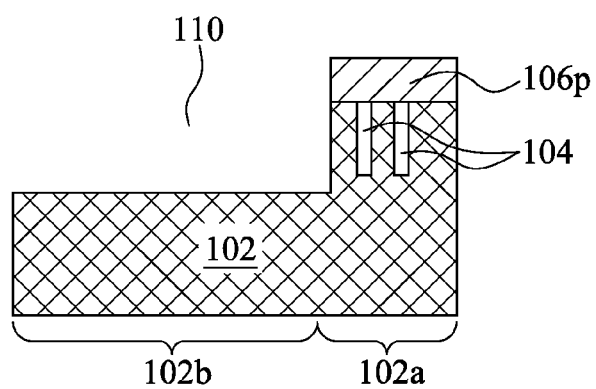
Figure 3F:
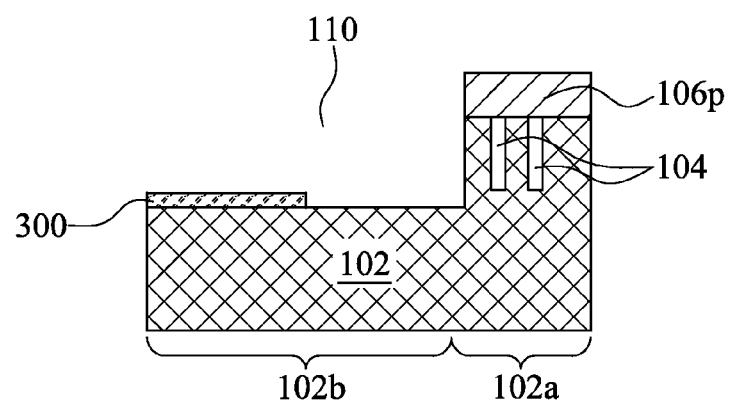

As shown in FIG. 3F, a patterned fourth photoresist 300 may be formed over a portion of the bottom surface of the first opening 110. The patterned fourth photoresist 300 may, for example, cover the portion of the semiconductor substrate 102 over which the second doped region 120 will be formed. In other words, the portion of the semiconductor substrate 102 over which the first doped region 114 is left exposed by the patterned fourth photoresist 300. The patterned fourth photoresist 300 may comprise similar materials and may be formed using similar processes as described above in respect of the patterned first photoresist 108.

Figure 3G:
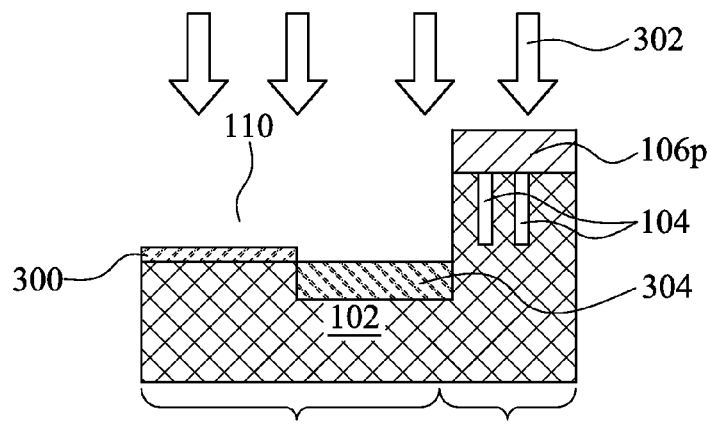

As shown in FIG. 3G, the patterned fourth photoresist 300 may be used as a mask in a doping process 302 that forms a P-well 304 in the portion of the semiconductor substrate 102 left exposed by the patterned fourth photoresist 300. The doping process 302 may be an implantation process or a diffusion process that is utilized to introduce the dopants into the material of the semiconductor substrate 102. Once the dopants have been introduced into the material of the semiconductor substrate 102, an anneal process may be performed to activate the dopants. Following the formation of the P-well 304, the patterned fourth photoresist 300 may be removed using, for example, a stripping process (e.g. a wet strip process) or an ashing process (e.g. plasma ashing process).

Figure 3H:
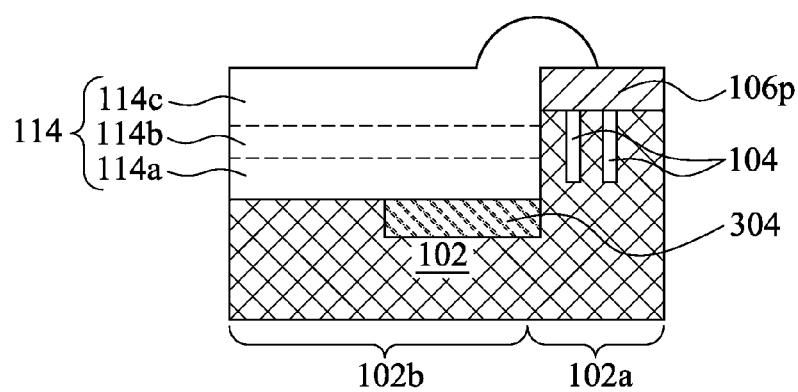
Figure 3I:
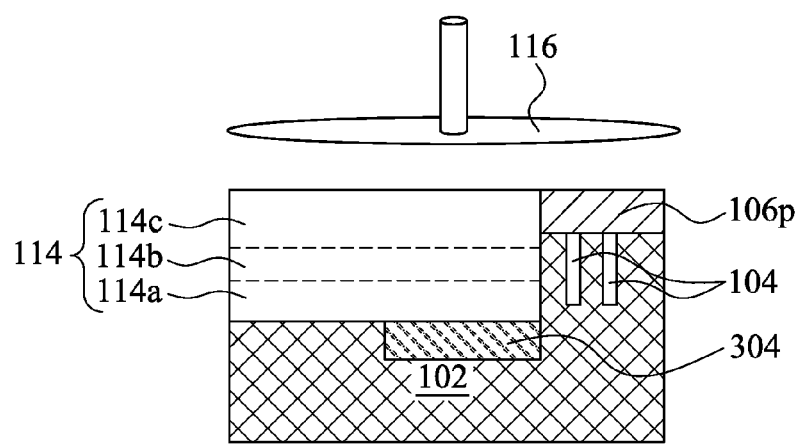
Figure 3J:
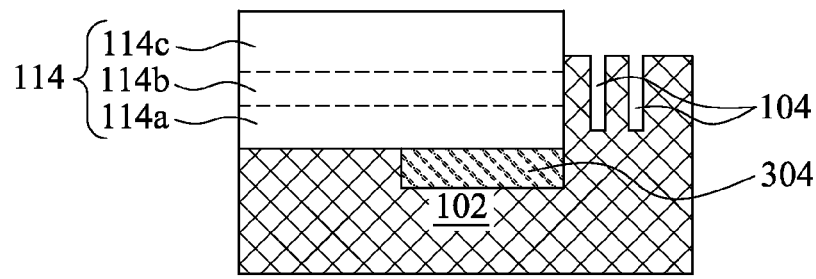

As shown in FIG. 3H, after the P-well 304 has been formed, the first opening 110 may be filled with semiconductor material to form the first doped region 114 (e.g. N-type doped region) using one or more of the processes described above in relation of FIG. 1G. Thereafter, as shown in FIG. 3I, the first planarization process 116 may be utilized to planarize the first doped region 114 and to expose the surface of the patterned first hard mask 106. Subsequently, as shown in FIG. 3J, the patterned first hard mask 106 may be removed from over the first region 102a of the semiconductor substrate 102 (e.g. from over one or more alignment marks 104). This may be achieved by a stripping process (e.g. a wet strip process) or an ashing process (e.g. plasma ashing process) that leaves the first doped region 114 substantially unperturbed.

Figure 3K:
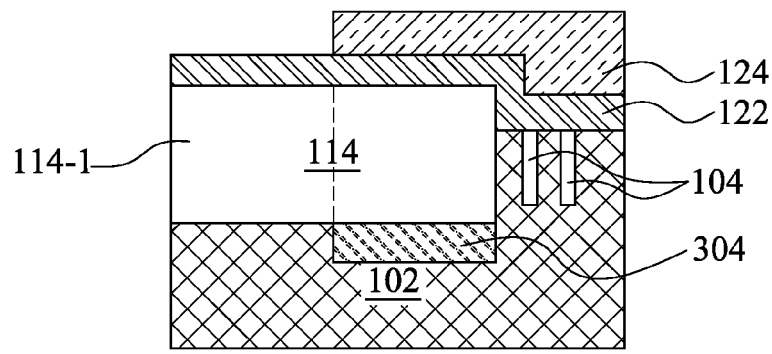
Figure 3L:
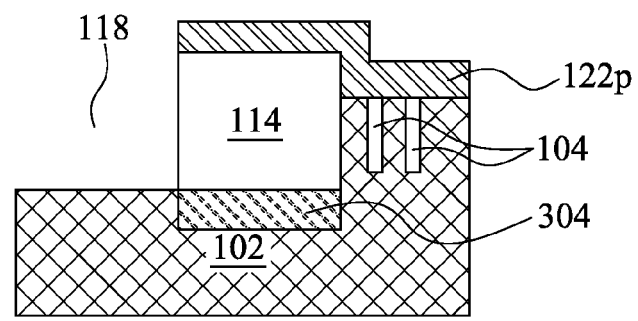

Following this, the portion 114-1 of the first doped region 114 may be removed to form the second opening 118, e.g. in order to provide space to form the second VGAA device 192. The steps for removing the portion 114-1 of the first doped region 114 are shown in the examples of FIGS. 3K and 3L where a masking and etching process is used and is described above in relation to FIGS. 1J and 1K. However, it should be understood that other suitable methods of removing the portion 114-1 of the first doped region 114 may be utilized in other embodiments.

Figure 3M:
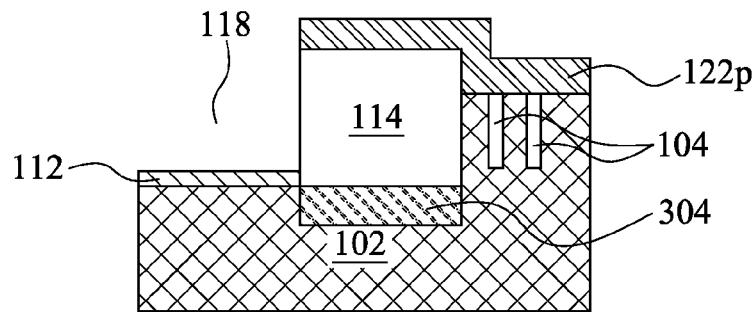

After forming the second opening 118, the semiconductive layer 112 may be selectively formed over a bottom surface of the second opening 118, as shown in FIG. 3M. In other words, the semiconductive layer 112 may be formed over the bottom surface of the second opening 118, while sidewalls of the second opening 118 are substantially free from the semiconductive layer 112. The semiconductive layer 112 may be formed using one or more of the processes described above in relation to FIG. 1F.

Figure 3N:
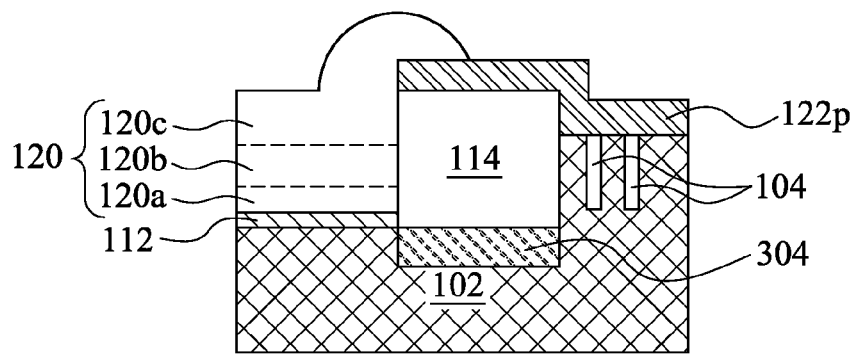

Thereafter, as shown in FIG. 3N, the second opening 118 may be filled with semiconductor material to form the second doped region 120, e.g. as described above in relation to FIG. 1L. The formation of the second doped region 120 may be continued at least until the second opening 118 has been filled. Additionally, to ensure a complete filling of the second opening 118, the second doped region 120 may overfill the second opening 120, as shown in FIG. 3N. Such an overfilling can result in the second doped region 120 partially extending over the patterned second hard mask 122p, as shown in FIG. 3N.

Figure 3O:
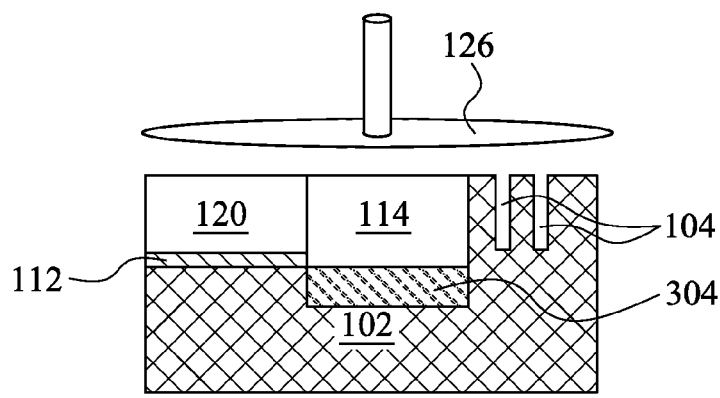

FIG. 3O illustrates the second planarization process 126, which is utilized to planarize the first doped region 114, the second doped region 120, and the patterned second hard mask 122p, e.g. to expose the one or more alignments marks 104, e.g. as described above in relation to FIG. 1M.

Figure 3P:
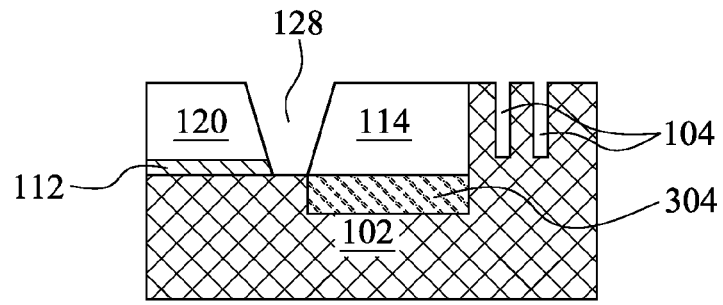
Figure 3Q:
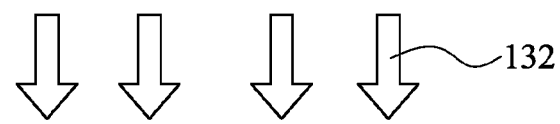
Figure 3Q:
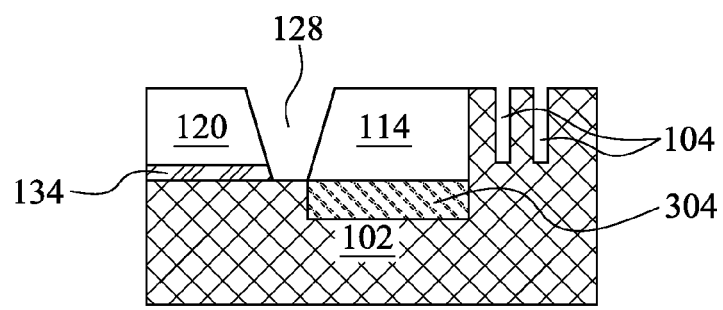
Figure 3R:
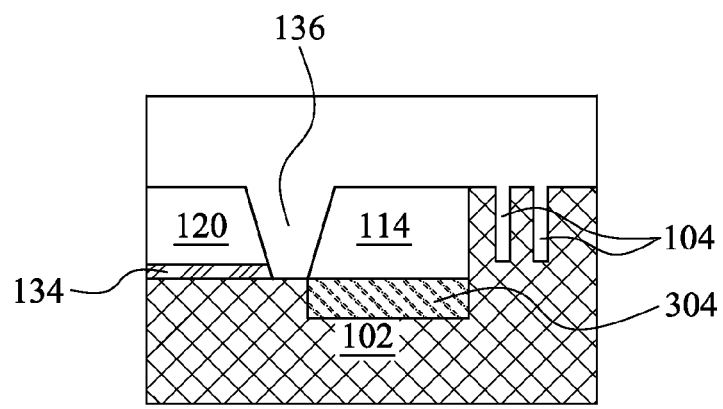
Figure 3S:
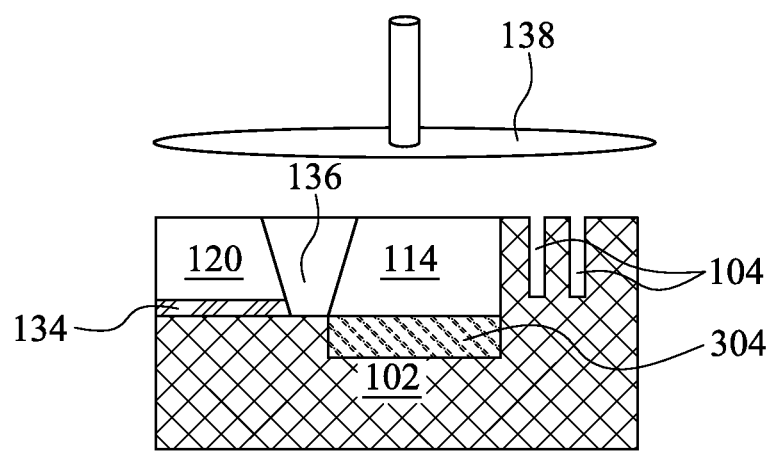
Figure 3T:
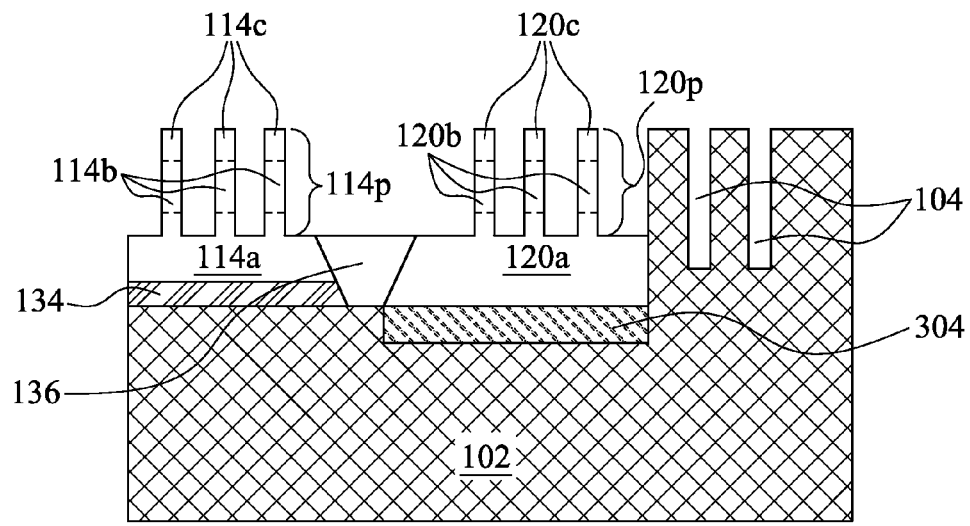

FIG. 3P shows the formation of the recess 128 that physically separates the first doped region 114 and the second doped region 120 from each other. The recess 128 may be formed using one or more of the processes described above in relation to FIG. 1O. Thereafter, as shown in FIG. 3Q, the oxidation process 132 (described above in respect of FIG. 1P) may be performed on the semiconductive layer 112 to form the oxidized isolation layer 134 beneath the second doped region 120. Thereafter, as shown in FIGS. 3R to 3U, the process flow for forming the first VGAA device 190 and the second VGAA device 192 may proceed in a similar manner as described above in relation to FIGS. 1Q to 1T.

Figure 3U:
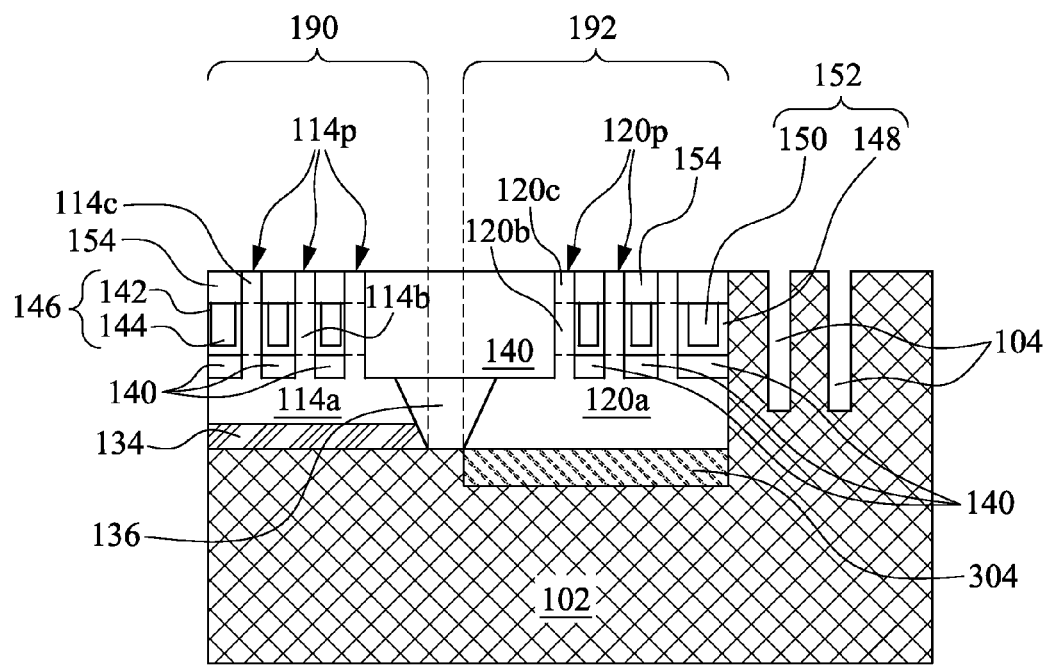

At least a part of the first VGAA device 190 and the second VGAA device 192 may be formed in the semiconductor substrate 102 using the process flow shown in FIGS. 3A to 3U. An advantage provided by the method described above includes provision of an amorphous and/or non-conductive layer (e.g. the oxidized isolation layer 134) below the second VGAA device 192 that can provide electrical isolation between the semiconductor substrate 102 and the second VGAA 192 device. This, in turn, reduces or prevents leakage current between the first VGAA device 190 and the second VGAA device 192.

Figure 4A:
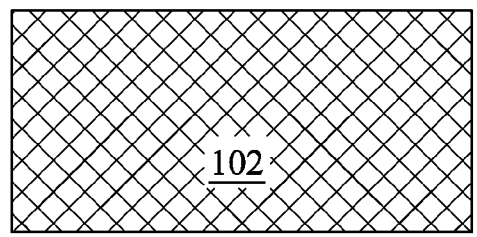
Figure 4B:
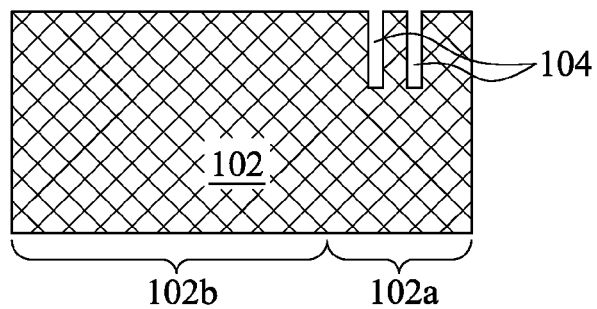
Figure 4C:
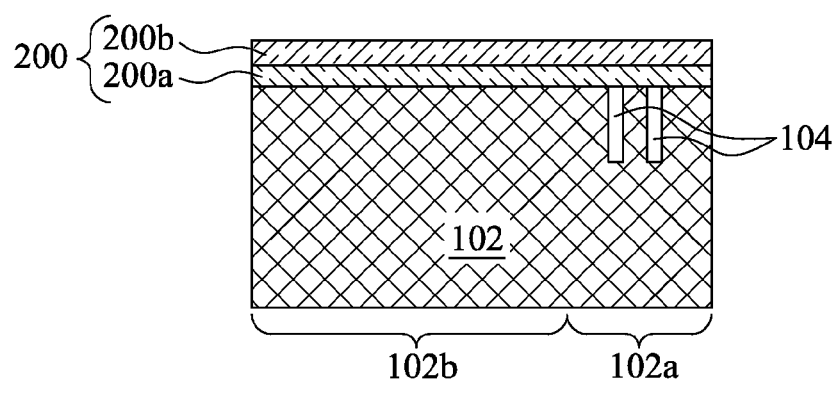
Figure 4D:
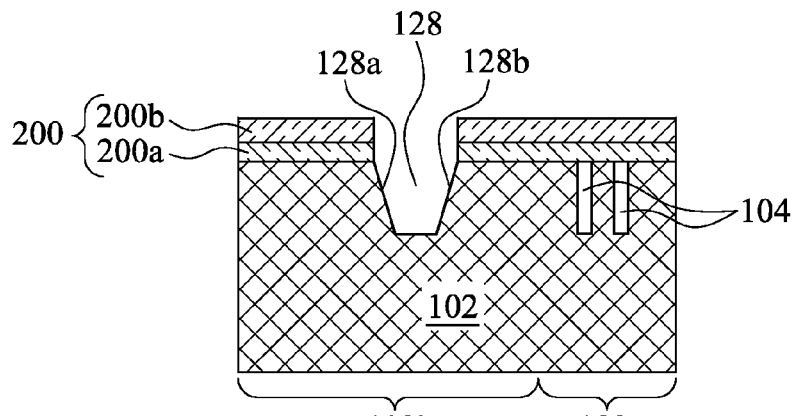
Figure 4E:
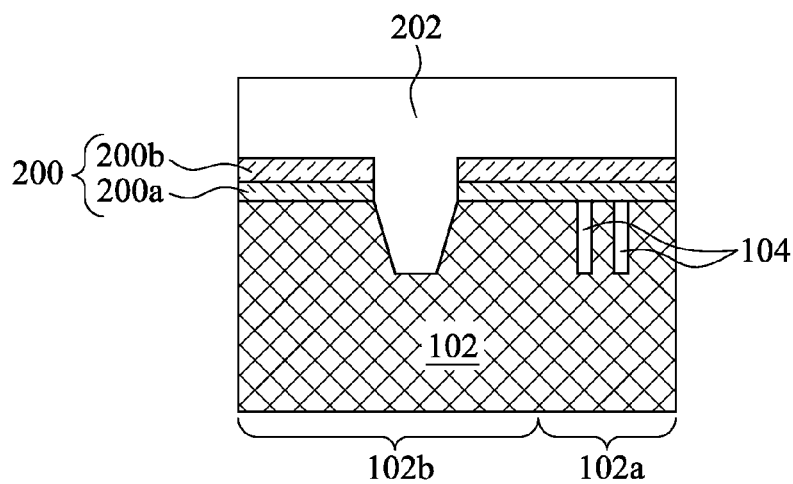
Figure 4F:
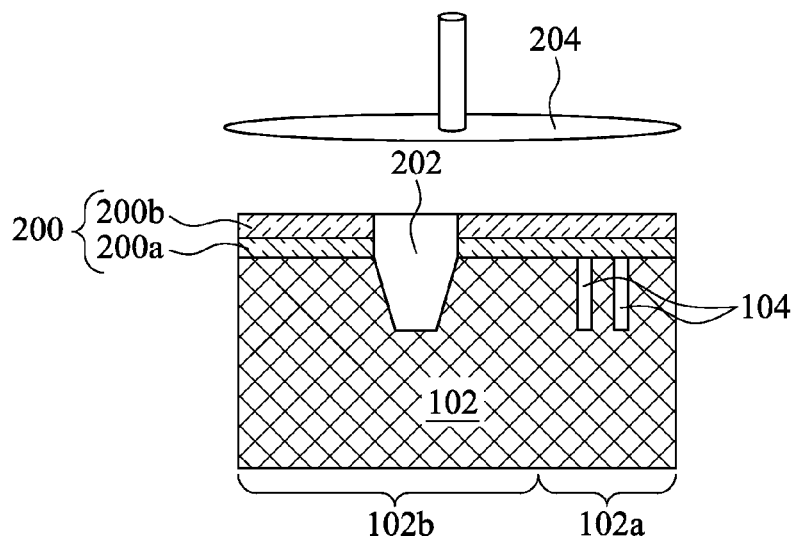
Figure 4G:
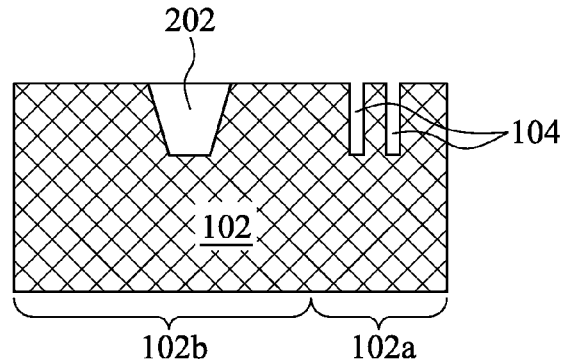
Figure 4H:
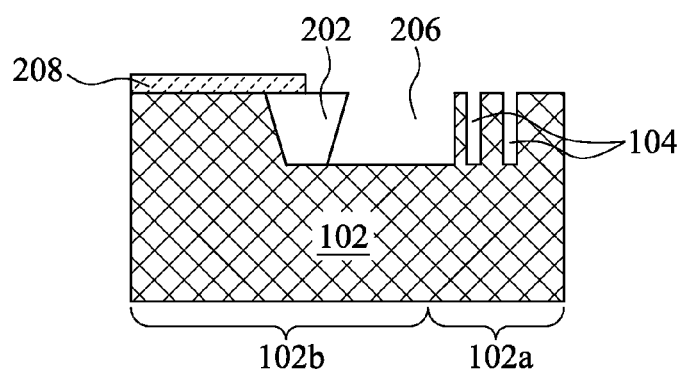
Figure 4I:
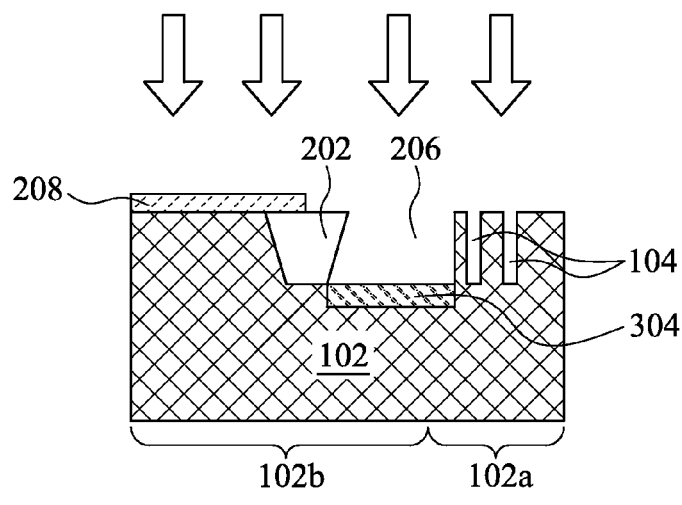

As shown in FIGS. 3A to 3U, in forming the first VGAA device 190 and the second VGAA device 192 in the semiconductor substrate 102, the formation of the P-well 304, the first doped region 114, and the second doped region 120 are performed prior to the formation of the recess 128. However, in another embodiment, the recess 128 may be formed in the semiconductor substrate 102 prior to forming the P-well 304, the first doped region 114, and the second doped region 120, e.g. in order to separate (e.g. physically separate) regions of the semiconductor substrate 102 in which the first doped region 114 and the second doped region 120 are subsequently formed. Such an embodiment is shown in FIGS. 4A to 4R.

FIGS. 4A to 4H illustrate the formation of the one or more alignment marks 104, the recess 128, the separation feature 202, and the third opening 206, as described above in relation to FIGS. 2A to 2H. Following this, as shown in FIG. 4I, the doping process 302 may be applied to the semiconductor substrate 102 such that the P-well 304 is formed in the portion of the semiconductor substrate 102 below the third opening 206.

Figure 4J:
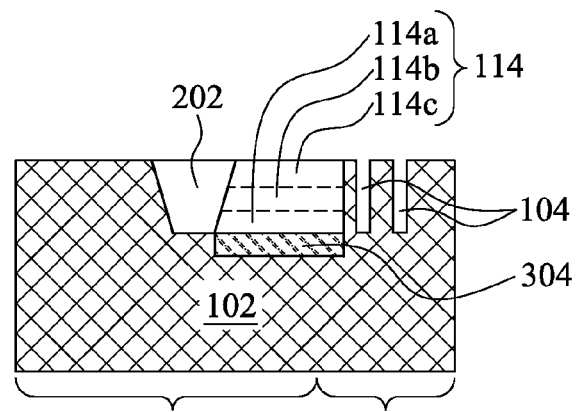

Referring to FIG. 4J, the first doped region 114 may be formed over the P-well 304 and may fill the third opening 206. The processes used to form the first doped region 114 in the third opening 206 may be similar to those described above in relation to FIGS. 1F to 1H.

Figure 4K:
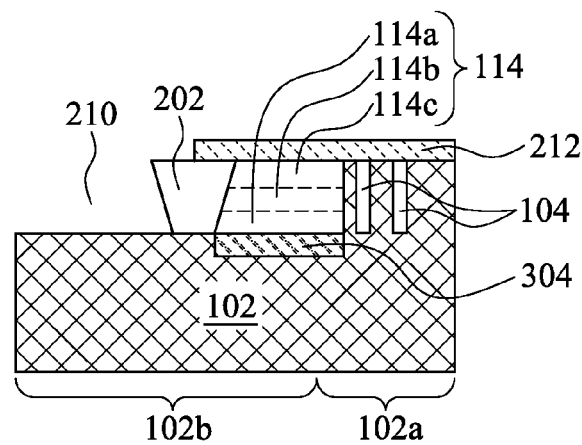

Referring to FIG. 4K, the fourth opening 210 may be formed in the semiconductor substrate 102 to provide space in the semiconductor substrate 102 to form the semiconductive layer 112 and the second doped region 114. The fourth opening 210 may be formed in the semiconductor substrate 102 adjacent to the side of the separation feature 202 facing away from the one or more alignment marks 104. The fourth opening 210 may be formed using a masking and etching process (e.g. a lithographic masking followed by a dry or wet etch process) using the fifth hard mask 212 as a mask. However, other suitable processes for forming the fourth opening 210 in the semiconductor substrate 102 may also be used. The fifth hard mask 212 may be formed over the semiconductor substrate 102 and may be patterned using one or more of the processes described above in relation to the first hard mask 106.

Figure 4L:
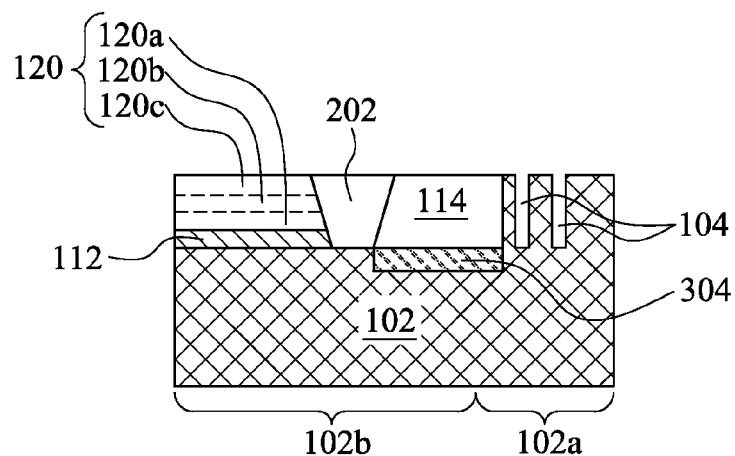

Referring to FIG. 4L, the semiconductive layer 112 may line the bottom surface of the fourth opening 210 and the second doped region 120 may be formed over the semiconductive layer 112 and may fill the fourth opening 210. The process flow steps used to form the semiconductive layer 112 and the second doped region 120 in the fourth opening 210 may be similar to those described above in relation to FIGS. 1F and 1K to 1M.

Figure 4M:
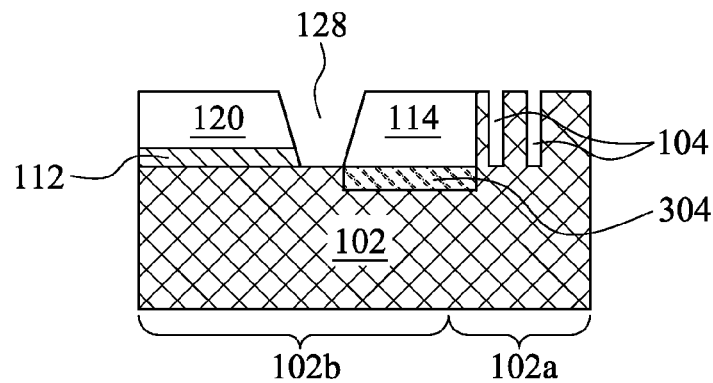
Figure 4N:
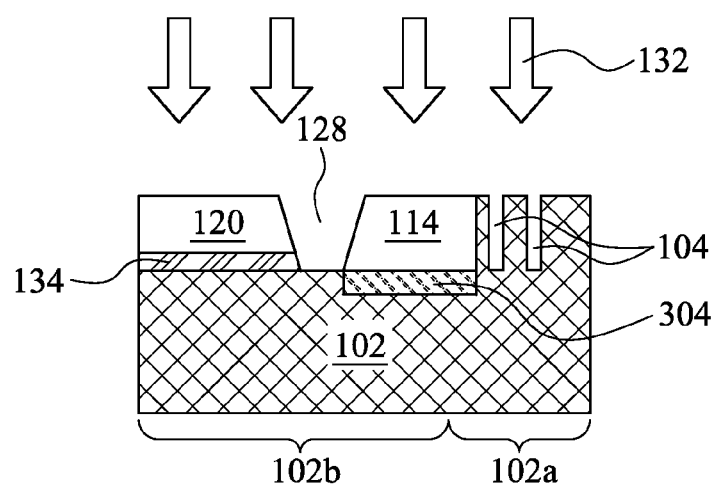
Figure 4O:
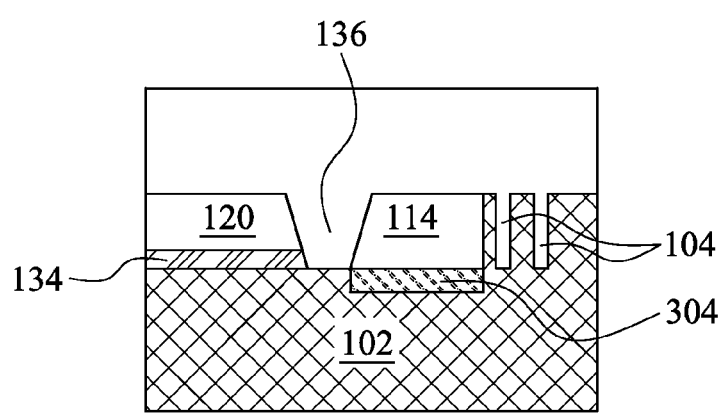
Figure 4P:
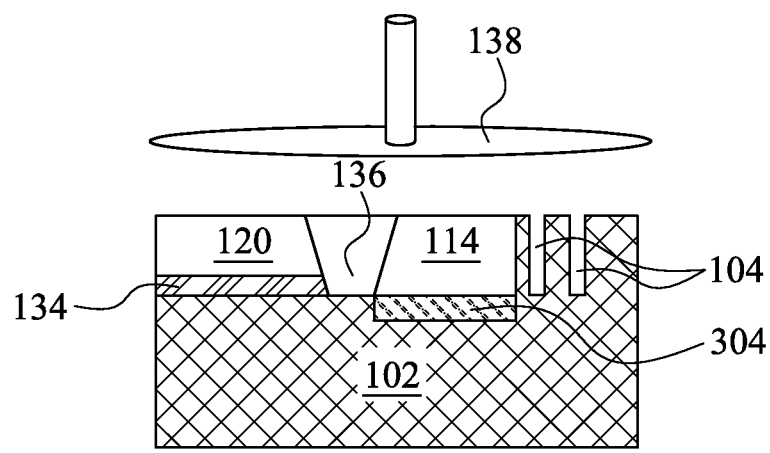
Figure 4Q:
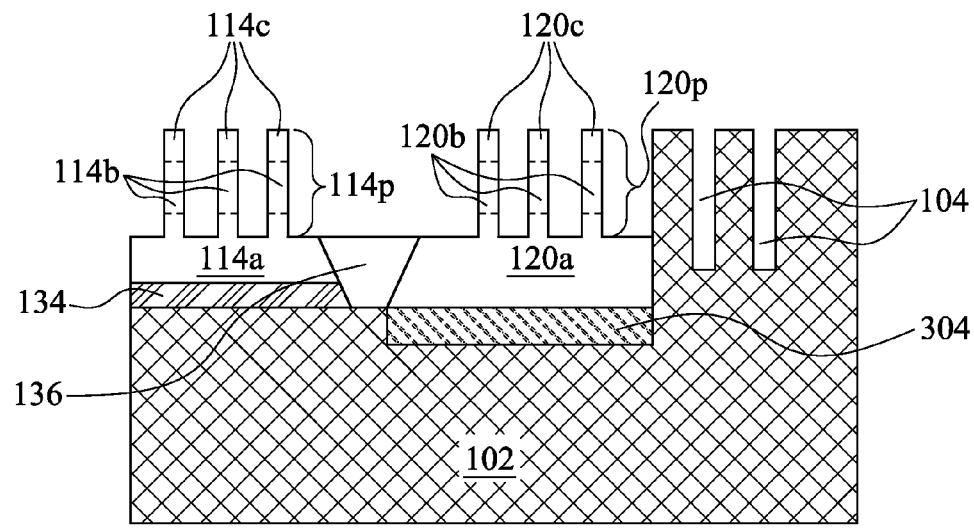
Figure 4R:
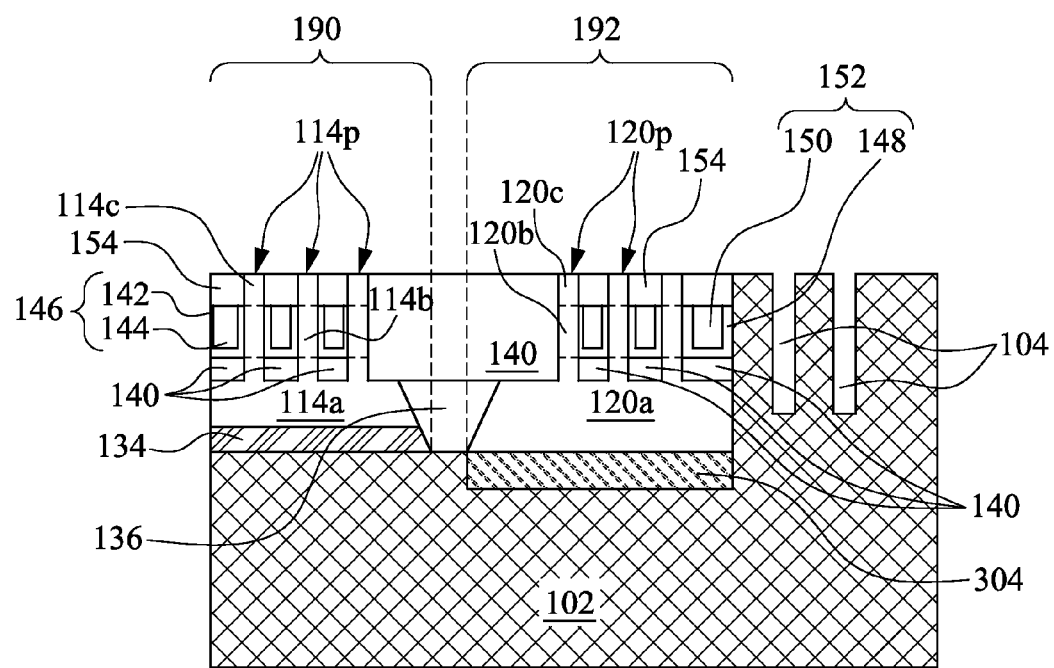

Referring to FIG. 4M, the separation feature 202 that physically separates the first doped region 114 and the second doped region 120 may be removed (e.g. using a dry and/or wet etch process). By removing the separation feature 202, edge regions of the semiconductive layer 112 proximal the recess 128 may be exposed. Thereafter, as shown in FIG. 4N, the oxidation process 132 may be performed on the semiconductive layer 112 to form the oxidized isolation layer 134. The details of the oxidation process 132 are described above in relation to FIG. 1P. Thereafter, as shown in FIGS. 4O to 4R, the process flow for forming the first VGAA device 190 and the second VGAA device 192 may proceed in a similar manner as described above in relation to FIGS. 1Q to 1T.

At least a part of the first VGAA device 190 and the second VGAA device 192 may be formed in the semiconductor substrate 102 using the process flow shown in FIGS. 4A to 4R. An advantage provided by the method described above includes provision of an amorphous and/or non-conductive layer (e.g. the oxidized isolation layer 134) below the second VGAA device 192 that can provide electrical isolation between the semiconductor substrate 102 and the second VGAA 192 device. This, in turn, reduces or prevents leakage current between the first VGAA device 190 and the second VGAA device 192.

The process flows shown in FIGS. 1A to 1T, FIGS. 2A to 2Q, FIGS. 3A to 3U, and FIGS. 4A to 4R show the formation of the first doped region 114 prior to the formation of the second doped region 120. However, in other embodiments, the process flows shown in these figures may be appropriately modified such that the second doped region 120 is formed prior to the first doped region 114.

Figure 5A:
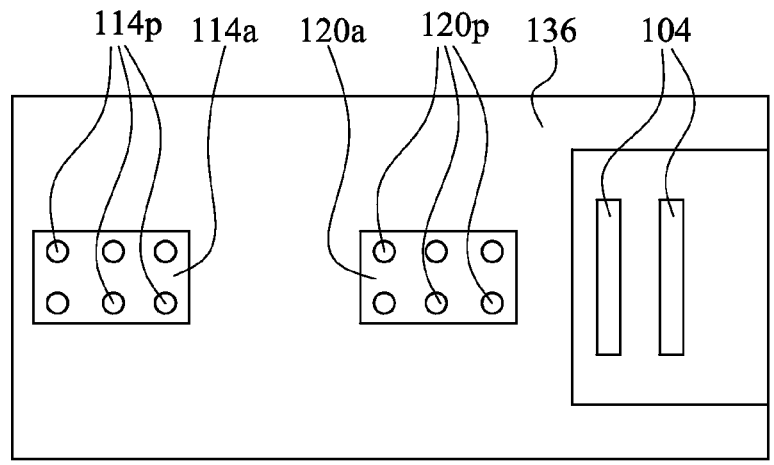
FIGS. 5A to 5C show top-down views illustrating shapes of first protrusions and second protrusions extending from a first doped region and a second doped region, respectively, in accordance with one or more embodiments.
Figure 5B:
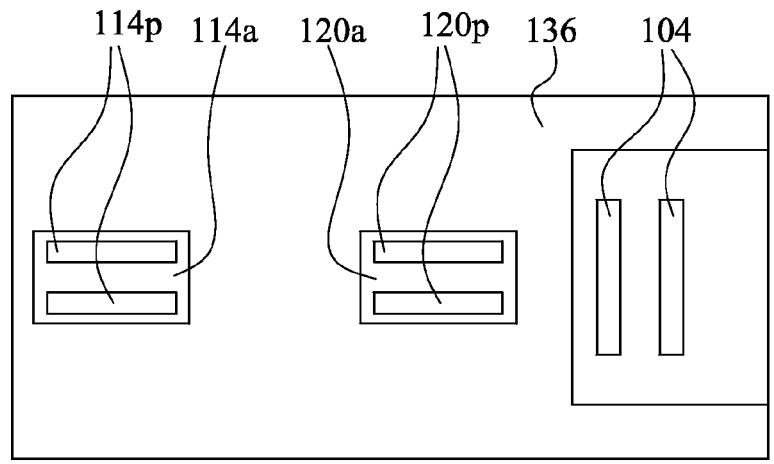
Figure 5C:
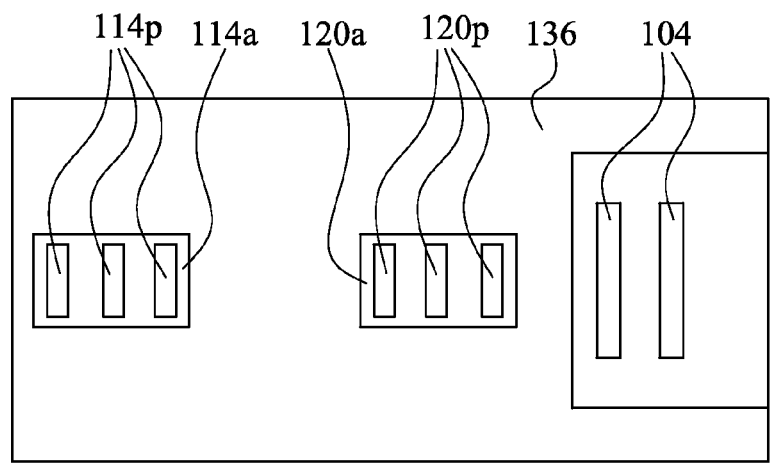

FIGS. 5A to 5C show plan views (e.g. top-down views) of the first protrusions 114p and the second protrusions 120p extending from the source layer 114a of the first doped region 114 and the source layer 120a of the second doped region 120, respectively. Also shown in FIGS. 5A to 5C is the isolation feature 136 surrounding the source layers 114a and 120a. As shown in FIG. 5A, the first protrusions 114p and the second protrusions 120p may be shaped as nanowires. In the embodiment of FIG. 5B, however, the first protrusions 114p and the second protrusions 120p may be shaped as bars that are substantially perpendicular to the one or more alignment marks 104. As another example, the first protrusions 114p and the second protrusions 120p may be shaped as bars that are substantially parallel to the one or more alignment marks 104, as shown in FIG. 5C.

Figure 6:
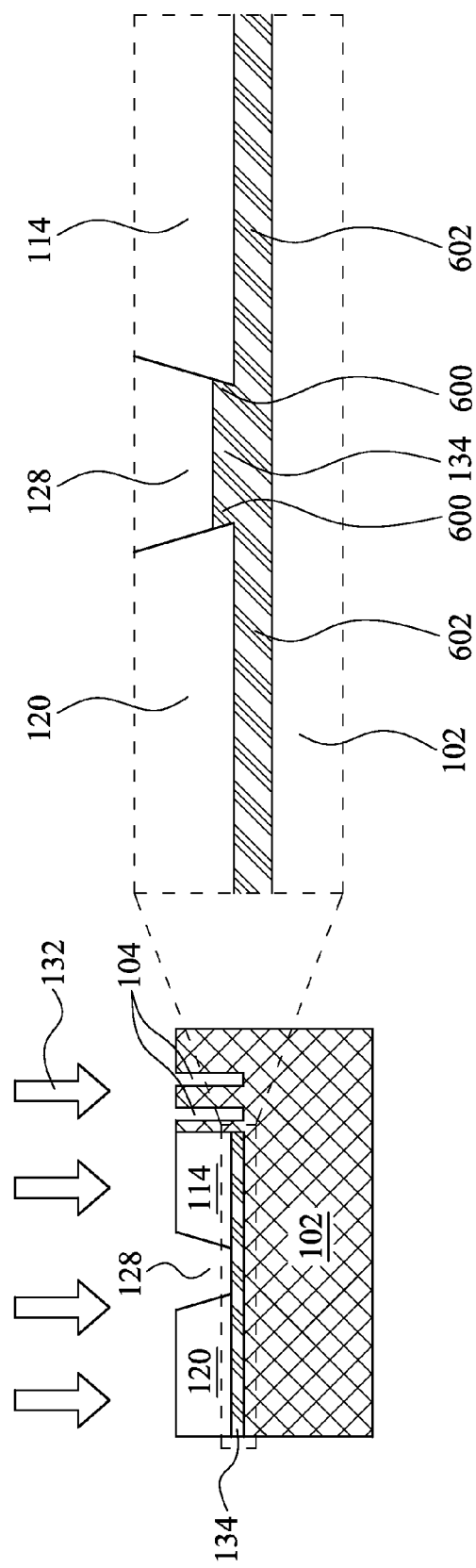
FIG. 6 shows an enlarged view of an oxidized isolation layer formed beneath a first doped region and a second doped region, in accordance with one or more embodiments.

FIG. 6 shows an enlarged view of the oxidized isolation layer 134 that may be formed beneath the first doped region 114 and the second doped region 120 or beneath the second doped region 120 only. As shown in FIG. 6, edge regions 600 of the oxidized isolation layer 134 (e.g. regions of the oxidized isolation layer 134 proximal or below edge regions of the first doped region 114 and/or the second doped region 120) have a thickness that is larger than central regions 602 of the oxidized isolation layer 134 (e.g. regions of the oxidized isolation layer 134 proximal or below central regions of the first doped region 114 and/or the second doped region 120). As described above in relation to FIG. 1P, during the oxidation process 132, oxygen penetrates into an edge region of the semiconductive layer 112. Some of the oxygen contained in the edge regions of the semiconductive layer 112 oxidizes the material of the semiconductive layer 112 to form the edge regions 600 of the oxidized isolation layer 134, while some oxygen diffuses into a central region of the semiconductive layer 112. Consequently, edge regions 600 of the oxidized isolation layer 134 may have a larger thickness than central regions 602 of the oxidized isolation layer 134.

According to an embodiment presented herein, a method of manufacturing a vertical gate all around (VGAA) device includes: forming a first doped region having a first conductivity in a substrate; forming a second doped region having a second conductivity different from the first conductivity in the substrate, the second doped region disposed laterally adjacent to and spaced apart from the first doped region; and oxidizing an isolation layer disposed between the substrate and the second doped region to form an oxidized isolation layer.

According to an embodiment presented herein, a method of manufacturing a vertical gate all around (VGAA) device includes: forming a first opening in a substrate; filling the first opening with a first semiconductor material having a first conductivity type; forming a second opening laterally adjacent to the first semiconductor material, wherein a bottom surface of the second opening is lined with an isolation layer; filling the second opening with a second semiconductor material having a second conductivity type different from the first conductivity type, the second semiconductor material overlying the isolation layer; forming a recess between the first semiconductor material and the second semiconductor material, the recess exposing an edge region of the isolation layer; and oxidizing the isolation layer having the exposed edge region to form and oxidized isolation layer.

According to an embodiment presented herein, a vertical gate all around (VGAA) device includes: a semiconductor substrate; a first doped region over the semiconductor substrate and comprising first protrusions; a second doped region over the semiconductor substrate and comprising second protrusions, the second doped region disposed laterally adjacent to and spaced apart from the first doped region; an oxidized isolation layer disposed between the second doped region and the semiconductor substrate; and a first gate stack disposed around the first protrusions and a second gate stack disposed around the second protrusions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first doped region having a first conductivity in a substrate;
    forming a second doped region having a second conductivity different from the first conductivity in the substrate, the second doped region disposed laterally adjacent to and spaced apart from the first doped region;
    patterning the first doped region to form first protrusions and patterning the second doped region to form second protrusions; and
    oxidizing a semiconductive layer disposed between the substrate and the second doped region to form an oxidized isolation layer.

2. The method of claim 1, wherein the first doped region comprises N-type dopants and the second doped region comprises P-type dopants.

3. The method of claim 1, wherein the semiconductive layer is further disposed between the substrate and the first doped region.

4. The method of claim 1, wherein the oxidizing the semiconductive layer comprises exposing at least a portion of the semiconductive layer to an oxygen-containing ambient environment.

5. The method of claim 1, wherein the oxidizing the semiconductive layer comprises exposing at least a portion of the semiconductive layer to an oxygen-containing plasma.

6. The method of claim 1, wherein the oxidizing the semiconductive layer comprises exposing at least a portion of the semiconductive layer to an annealing process.

7. The method of claim 6, wherein the annealing process comprises an oxygen anneal or a steam anneal.

8. The method of claim 1, wherein the first protrusions and the second protrusions comprise channel regions of a first vertical gate all around device and a second vertical gate all around device, respectively.

9. The method of claim 1, wherein the first protrusions and the second protrusions comprise nanowires, bars, or a combination thereof.

10. The method of claim 1 further comprising forming a recess between the first doped region and the second doped region.

11. A method, comprising:
    forming a first opening in a substrate;
    filling the first opening with a first semiconductor material having a first conductivity type;
    forming a second opening laterally adjacent to the first semiconductor material, wherein a bottom surface of the second opening is lined with a semiconductive layer;
    filling the second opening with a second semiconductor material having a second conductivity type different from the first conductivity type, the second semiconductor material overlying the semiconductive layer;
    forming a recess between the first semiconductor material and the second semiconductor material, the recess exposing an edge region of the semiconductive layer; and
    oxidizing the semiconductive layer having the exposed edge region to form an oxidized isolation layer.

12. The method of claim 11, wherein the semiconductive layer comprises silicon-germanium, with germanium having a concentration greater than or equal to about 20%.

13. The method of claim 11, wherein the filling the first opening with the first semiconductor material and the filling the second opening with the second semiconductor material comprises an epitaxy process.

14. The method of claim 11, wherein the semiconductive layer is formed on the bottom surface of the second opening using an epitaxy process.

15. The method of claim 11, wherein the semiconductive layer further lines a bottom surface of the first opening, and wherein the filling the first opening with the first semiconductor material comprises forming the first semiconductor material over the semiconductive layer.

16. The method of claim 11, wherein the semiconductive layer has a thickness of at least 1 nanometer.

17. A vertical gate all around device, comprising:
    a semiconductor substrate;
    a first doped region over the semiconductor substrate and comprising first protrusions;
    a second doped region over the semiconductor substrate and comprising second protrusions, the second doped region disposed laterally adjacent to and spaced apart from the first doped region;
    an oxidized isolation layer disposed between the second doped region and the semiconductor substrate; and
    a first gate stack disposed around the first protrusions and a second gate stack disposed around the second protrusions.

18. The device of claim 17, wherein the oxidized isolation layer comprises silicon, germanium, and oxygen.

19. The device of claim 17, further comprising an isolation feature disposed between the first doped region and the second doped region.

20. The device of claim 19, wherein a thickness of an edge region of the oxidized isolation layer proximal the isolation feature is greater than a thickness of a central region of the oxidized isolation layer distal the isolation feature.

* * * * *